(12) United States Patent
Sakata et al.

(10) Patent No.: US 8,278,657 B2
(45) Date of Patent: *Oct. 2, 2012

(54) TRANSISTOR, SEMICONDUCTOR DEVICE INCLUDING THE TRANSISTOR, AND MANUFACTURING METHOD OF THE TRANSISTOR AND THE SEMICONDUCTOR DEVICE

(75) Inventors: Junichiro Sakata, Atsugi (JP); Hiromichi Godo, Isehara (JP); Takashi Shimazu, Machida (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 163 days.

This patent is subject to a terminal disclaimer.

(21) Appl. No.: 12/699,974

(22) Filed: Feb. 4, 2010

(65) Prior Publication Data
US 2010/0207118 A1 Aug. 19, 2010

(30) Foreign Application Priority Data

Feb. 13, 2009 (JP) .................................. 2009-030969

(51) Int. Cl.
*H01L 29/786* (2006.01)

(52) U.S. Cl. .................... 257/43; 257/59; 257/E21.412; 257/E29.296; 257/E21.46; 257/E23.013; 438/104; 438/158

(58) Field of Classification Search .................... 257/43, 257/57, E21.414, E29.068, E29.296, 104
See application file for complete search history.

(56) References Cited

U.S. PATENT DOCUMENTS

| | | | | |
|---|---|---|---|---|
| 4,862,234 | A | * | 8/1989 | Koden .............................. 257/60 |
| 5,021,850 | A | * | 6/1991 | Tanaka et al. .................... 257/59 |
| 5,731,856 | A | | 3/1998 | Kim et al. |
| 5,744,864 | A | | 4/1998 | Cillessen et al. |
| 6,294,274 | B1 | | 9/2001 | Kawazoe et al. |
| 6,563,174 | B2 | | 5/2003 | Kawasaki et al. |
| 6,727,522 | B1 | | 4/2004 | Kawasaki et al. |
| 7,049,190 | B2 | | 5/2006 | Takeda et al. |
| 7,061,014 | B2 | | 6/2006 | Hosono et al. |
| 7,064,346 | B2 | | 6/2006 | Kawasaki et al. |
| 7,105,868 | B2 | | 9/2006 | Nause et al. |

(Continued)

FOREIGN PATENT DOCUMENTS

EP 1737044 A 12/2006

(Continued)

OTHER PUBLICATIONS

Nomura et al., "Room-Temperature Fabrication of Transparent Flexible Thin-Film Transistors Using Amorphous Oxide Semiconductors," Nature, Nov. 25, 2004, vol. 432, pp. 488-492.

(Continued)

*Primary Examiner* — Mamadou Diallo
(74) *Attorney, Agent, or Firm* — Eric J. Robinson; Robinson Intellectual Property Law Office, P.C.

(57) ABSTRACT

To suppress deterioration in electrical characteristics in a transistor including an oxide semiconductor layer or a semiconductor device including the transistor. In a transistor in which a channel layer is formed using an oxide semiconductor, a silicon layer is provided in contact with a surface of the oxide semiconductor layer. Further, the silicon layer is provided in contact with at least a region of the oxide semiconductor layer, in which a channel is formed, and a source electrode layer and a drain electrode layer are provided in contact with regions of the oxide semiconductor layer, over which the silicon layer is not provided.

8 Claims, 28 Drawing Sheets

U.S. PATENT DOCUMENTS

| | | | |
|---|---|---|---|
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,420,209 | B2 * | 9/2008 | Suzawa et al. ............ 257/59 |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,923,311 | B2 * | 4/2011 | Zhang et al. ............ 438/151 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0197350 | A1 | 8/2008 | Park et al. |
| 2008/0203387 | A1 | 8/2008 | Kang et al. |
| 2008/0224133 | A1 * | 9/2008 | Park et al. ............ 257/43 |
| 2008/0224147 | A1 * | 9/2008 | Nagata et al. ............ 257/72 |
| 2008/0254569 | A1 | 10/2008 | Hoffman et al. |
| 2008/0258139 | A1 | 10/2008 | Ito et al. |
| 2008/0258140 | A1 * | 10/2008 | Lee et al. ............ 257/43 |
| 2008/0258141 | A1 * | 10/2008 | Park et al. ............ 257/43 |
| 2008/0258143 | A1 | 10/2008 | Kim et al. |
| 2008/0296568 | A1 * | 12/2008 | Ryu et al. ............ 257/43 |
| 2008/0308806 | A1 * | 12/2008 | Akimoto et al. ............ 257/59 |
| 2009/0008638 | A1 | 1/2009 | Kang et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0207117 | A1 | 8/2010 | Sakata et al. |
| 2010/0207119 | A1 | 8/2010 | Sakata et al. |
| 2010/0308324 | A1 * | 12/2010 | Kim et al. ............ 257/43 |

FOREIGN PATENT DOCUMENTS

| | | |
|---|---|---|
| EP | 2226847 A | 9/2010 |
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2007-096055 | 4/2007 |
| JP | 2007-150158 | 6/2007 |
| WO | WO-2004/114391 | 12/2004 |
| WO | WO 2008/105250 | 9/2008 |

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ ($m$= 3, 4, and 5), $InGaO_3(ZnO)_3$, and $Ga_2O_3(ZnO)_m$ ($m$= 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)_m$) ($m$: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=in,Ga; m=Integer) Described by Four-Dimensional Superspace Group,", Journal of Solid State Chemistry, 1998, vol. 139, pp. 347-355.

Son.K et al., "42,4L: Late-News Paper: 4 Inch QVGA AMOLED Driven by the Threshold Voltage Controlled Amorphous GIZO (Ga2O3-In2O3-ZnO) TFT,", SID Digest '08: SID International Symposium Digest of Technical Papers, May, 20, 2008, vol. 39, pp. 633-636.

Lee.J et al., "World'S Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:AL and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest'09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09: SID International Symposium Digest of Technical Papers, May 31, 2009, pp. 983-985.

Sakata.J et al., "Development of 4.0-In. Amoled Display With Driver Circuit Using Amorphous In-Ga-Zn-Oxide TFTs,", IDW '09: Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO Tfts) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3:4.0 in. Qvga Amoled Display Using In-Ga-Zn-Oxide TFTS With a Novel Passivation Layer,", SID Digest '09: SID International Symposium Digest of Technical Papers, May 31, 2009, pp. 284-287.

Miyasaka.M, "Suftla Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest ', 09: SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Lquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in The In2O3 and Sc2O3-BO Systems [A; Fe, Ga or Al; B: Mg, Mn, Fe, Ni, Cu, or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZn04,", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Ai2O3 Gate Insulator,", Appl. Phys. Lett. (Applied Physics Letters), Sep. 1, 2003, vol. 83, No. 9, pp. 1755-1757.

* cited by examiner

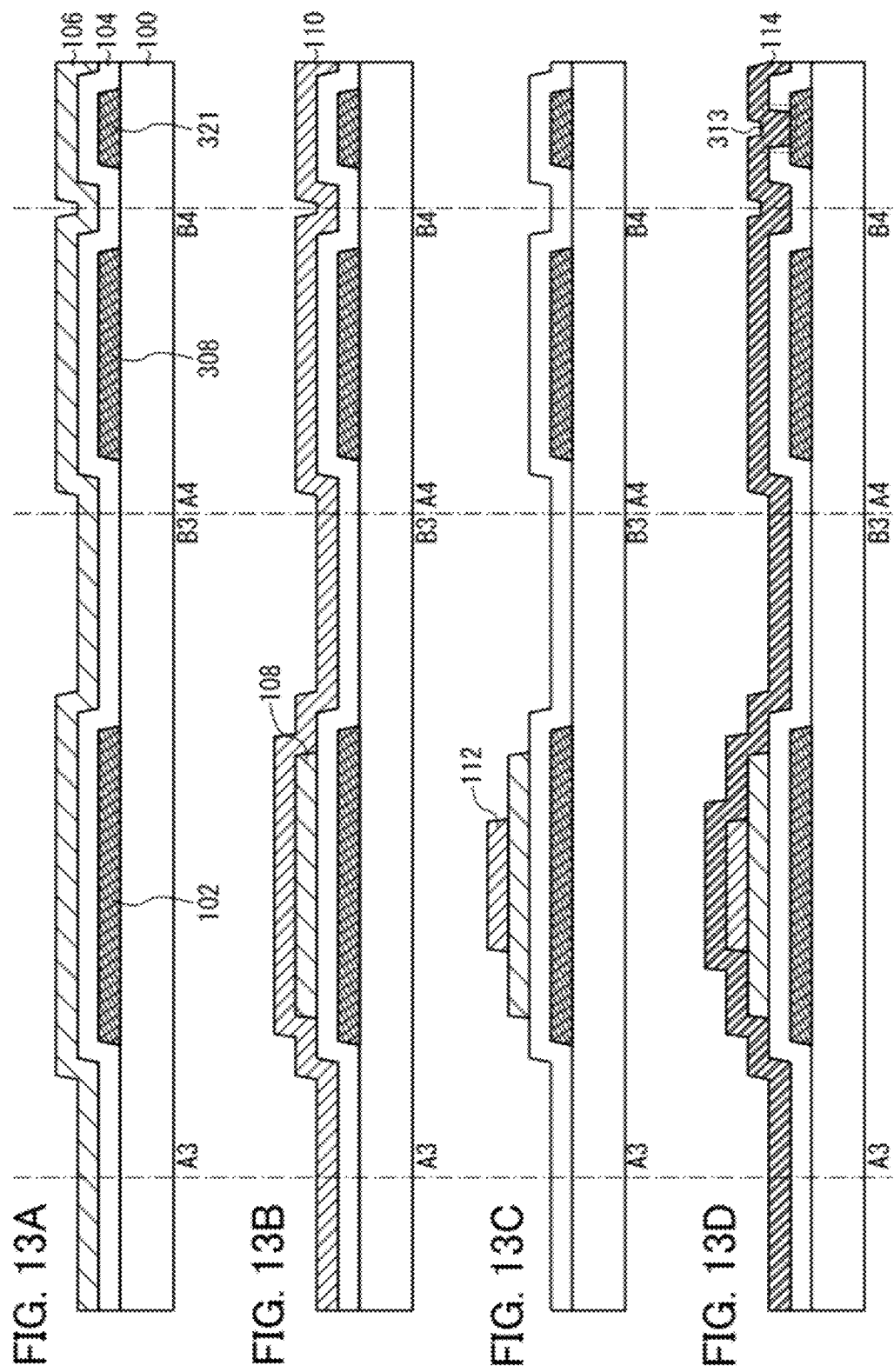

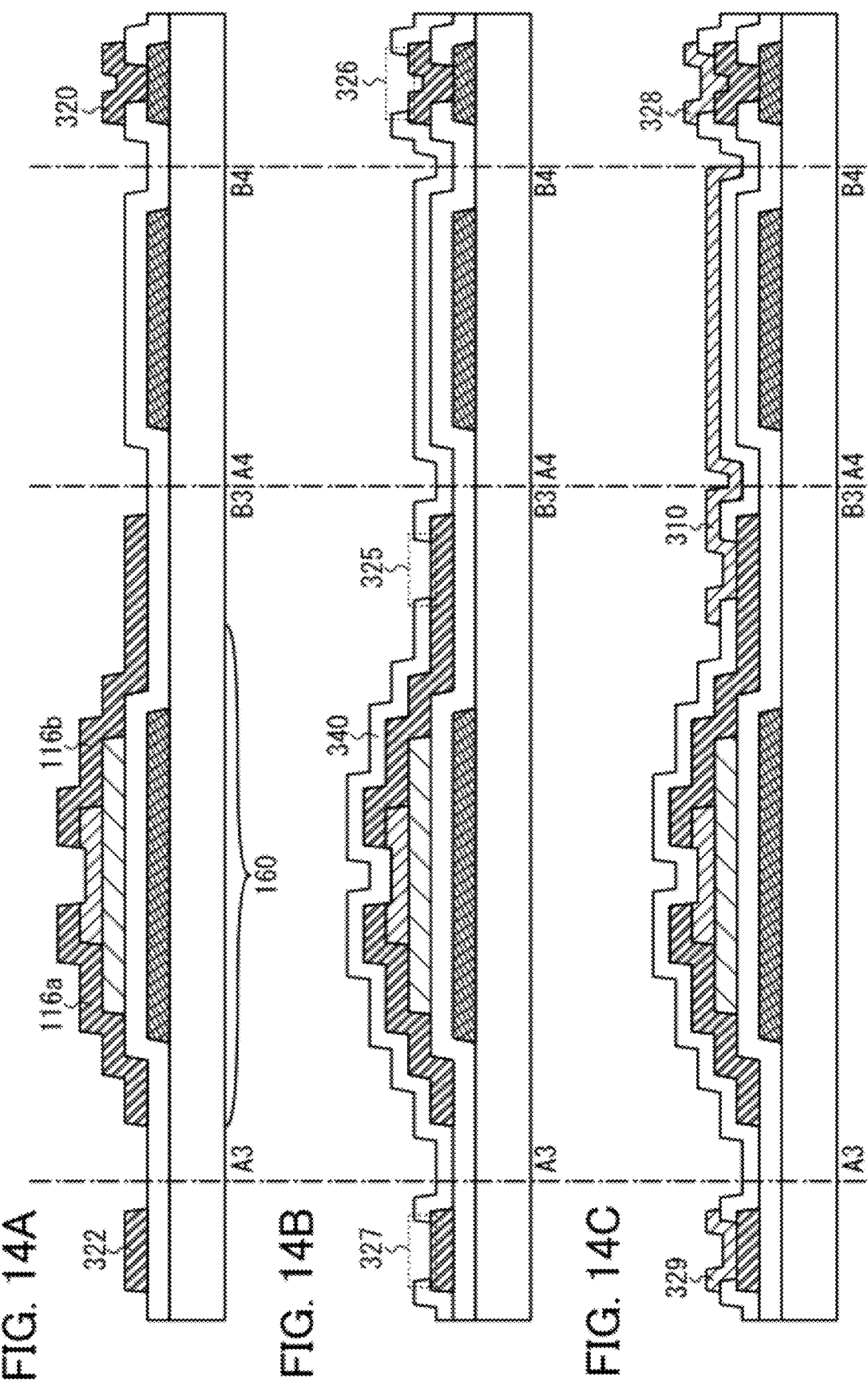

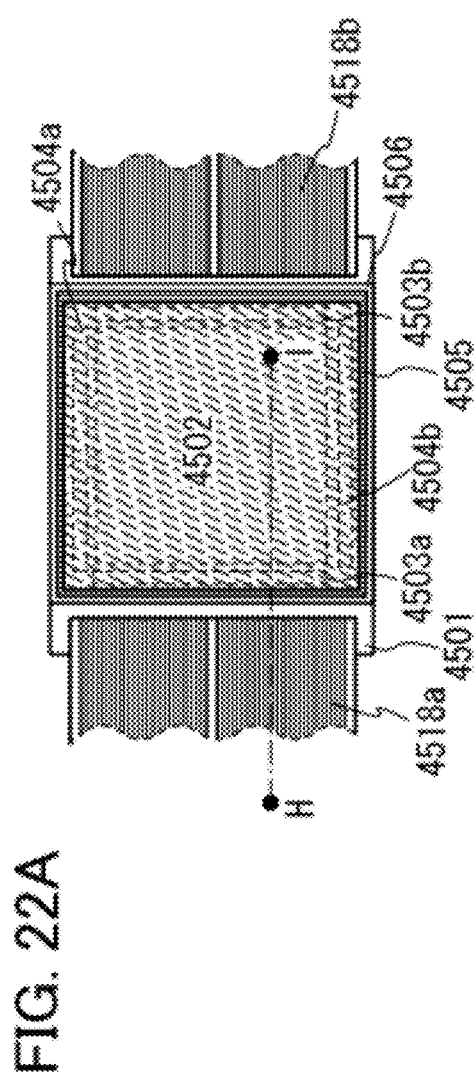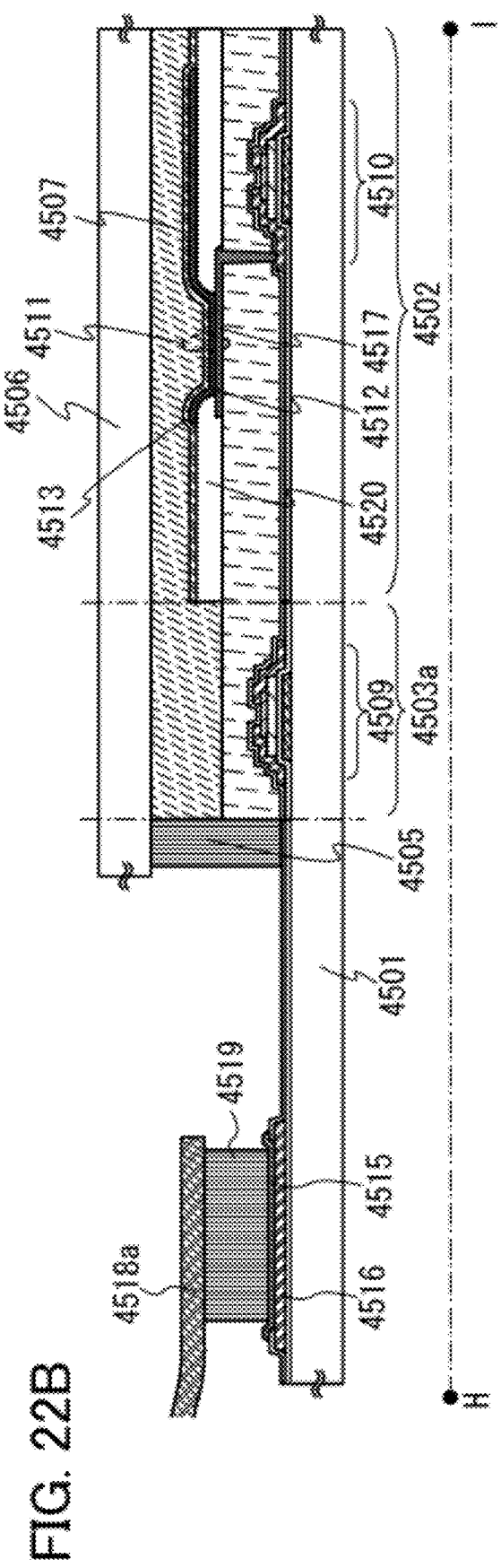
FIG. 22A
FIG. 22B a-Si:H Model a-SiO$_2$:H Model

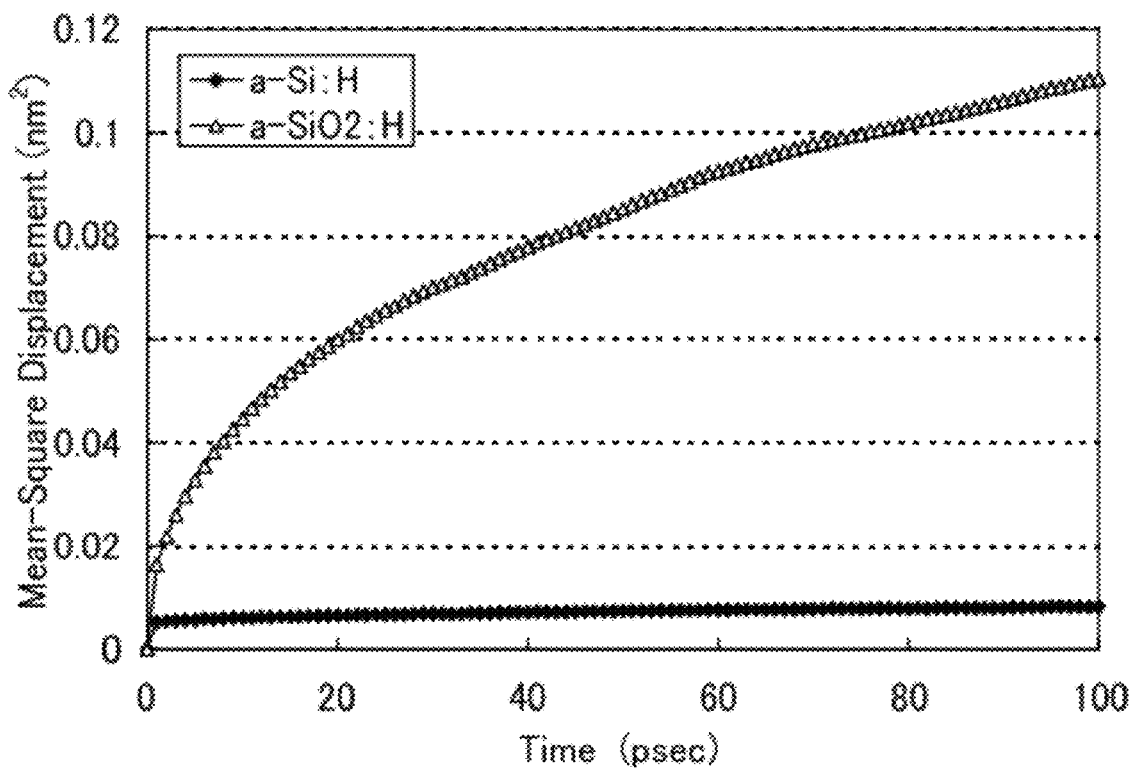

TRANSISTOR, SEMICONDUCTOR DEVICE INCLUDING THE TRANSISTOR, AND MANUFACTURING METHOD OF THE TRANSISTOR AND THE SEMICONDUCTOR DEVICE

BACKGROUND OF THE INVENTION

1. Field of the Invention

The present invention relates to a transistor that uses an oxide semiconductor layer, a semiconductor device including the transistor, and a manufacturing method of the transistor and the semiconductor device.

2. Description of the Related Art

There are various kinds of metal oxides, which are used for a wide range of applications. Indium oxide is a well-known material and used as a material of a transparent electrode which is needed in a liquid crystal display or the like.

Some metal oxides exhibit semiconductor characteristics. In general, metal oxides serve as insulators; however, it is known that metal oxides serve as semiconductors depending on the combination of elements included in the metal oxides.

For example, tungsten oxide, tin oxide, indium oxide, zinc oxide, and the like can be given as metal oxides exhibiting semiconductor characteristics, and thin film transistors in which a channel formation region is formed using such a metal oxide exhibiting semiconductor characteristics are already known (Patent Documents 1 to 4, Non-Patent Document 1).

As the metal oxides, not only single-component oxides but also multi-component oxides are known. For example, $InGaO_3(ZnO)_m$ (m: natural number) having a homologous series is known as a multi-component oxide semiconductor including In, Ga, and Zn (Non-Patent Documents 2 to 4).

Further, it is proved that the oxide semiconductor formed using an In—Ga—Zn based oxide as described above can be used for a channel layer of a thin film transistor (also referred to as a TFT) (Patent Document 5, Non-Patent Documents 5 and 6).

However, semiconductor characteristics are likely to vary because of damage to the oxide semiconductor due to an etchant or plasma or entry of an element such as hydrogen to the oxide semiconductor in an element manufacturing process. Accordingly, problems of variation and deterioration in electrical characteristics of the element are caused.

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor" *Appl. Phys. Lett.*, 17 Jun. 1996, Vol. 68 p. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, p. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, p. 170-178
[Non-Patent Document 4] M. Nakamura, N. Kimizuka, T. Mohri, and M. Isobe, "Syntheses and crystal structures of new homologous compound, indium iron zinc oxides ($InFeO_3(ZnO)_m$ (m: natural number) and related compounds", *KOTAI BUTSURI (SOLID STATE PHYSICS)*, 1993, Vol. 28, No. 5, p. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, p. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, p. 488-492

SUMMARY OF THE INVENTION

In view of the above-described problems, it is an object of an embodiment of the present invention to suppress variation and deterioration in electrical characteristics in a transistor including an oxide semiconductor layer or a semiconductor device including the transistor.

In order to achieve the above-described object, an embodiment of the present invention employs a structure where a silicon layer is provided over and in contact with a surface of an oxide semiconductor layer in a transistor in which a channel layer is formed using an oxide semiconductor. In this case, the silicon layer serves as a protective film for reducing entry of hydrogen or the like to the oxide semiconductor layer and also serves as a protective film for the oxide semiconductor layer during the manufacturing process, whereby variation and deterioration in electrical characteristics of the transistor can be suppressed.

Further, an embodiment of the present invention can employ a structure where a silicon layer is provided in contact with at least a region of an oxide semiconductor layer, in which a channel is formed, and a source electrode layer and a drain electrode layer are provided in contact with parts of the oxide semiconductor layer, which the silicon layer is not in contact with.

Further, an embodiment of the present invention can employ a structure where low-resistance regions serving as a source region and a drain region are provided in regions of an oxide semiconductor layer, over which a silicon layer is not provided, and a source electrode layer and a drain electrode layer are provided in contact with the low-resistance regions.

An embodiment of the present invention provides a transistor which includes a gate electrode, a gate insulating layer provided over the gate electrode, an oxide semiconductor layer provided over the gate insulating layer and overlapping with the gate electrode, a silicon layer provided over and in contact with a surface of the oxide semiconductor layer, and a source electrode layer and a drain electrode layer electrically connected to the oxide semiconductor layer. Further, the source electrode layer and the drain electrode layer can be provided over and in contact with at least parts of the surface of the oxide semiconductor layer, over which the silicon layer is not provided. Furthermore, a first low-resistance region serving as a source region can be provided in a region of the oxide semiconductor layer, which is in contact with the source electrode layer, and a second low-resistance region serving as a drain region can be provided in a region of the oxide semiconductor layer, which is in contact with the drain electrode layer.

Another embodiment of the present invention provides a transistor which includes a gate electrode; a gate insulating layer provided over the gate electrode; an oxide semiconductor layer provided over the gate insulating layer and overlapping with the gate electrode; a silicon layer provided over and in contact with a part of a surface of the oxide semiconductor layer; a first metal oxide layer and a second metal oxide layer provided over and in contact with at least other parts of the surface of the oxide semiconductor layer, over which the silicon layer is not provided; a source electrode layer electrically connected to the first metal oxide layer; and a drain electrode layer electrically connected to the second metal oxide layer.

Another embodiment of the present invention provides a transistor which includes a gate electrode, a gate insulating layer provided over the gate electrode, a source electrode layer and a drain electrode layer provided over the gate insulating layer, an oxide semiconductor layer provided over the source electrode layer and the drain electrode layer and provided over the gate electrode with the gate insulating layer interposed therebetween, and a silicon layer provided over and in contact with a surface of the oxide semiconductor layer.

Another embodiment of the present invention provides a manufacturing method of a transistor, which includes the steps of forming a gate electrode over a substrate, forming a gate insulating layer over the gate electrode, forming an oxide semiconductor layer over the gate insulating layer so as to overlap with the gate electrode, forming a silicon layer so as to cover the oxide semiconductor layer, etching the silicon layer to expose a part of the oxide semiconductor layer, forming a conductive film over the silicon layer and the oxide semiconductor layer, and etching the conductive film to form a source electrode layer and a drain electrode layer.

Another embodiment of the present invention provides a manufacturing method of a transistor, which includes the steps of forming a gate electrode over a substrate, forming a gate insulating layer over the gate electrode, forming an oxide semiconductor layer over the gate insulating layer so as to overlap with the gate electrode, forming a silicon layer so as to cover the oxide semiconductor layer, etching the silicon layer to expose a part of the oxide semiconductor layer, performing plasma treatment on the exposed part of the oxide semiconductor layer to form low-resistance regions, forming a conductive film over the silicon layer and the oxide semiconductor layer, and etching the conductive film to form a source electrode layer and a drain electrode layer.

In this specification, silicon oxynitride contains more oxygen than nitrogen, and in the case where measurements are conducted using Rutherford backscattering spectrometry (RBS) and hydrogen forward scattering (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

In this specification, a semiconductor device means any device which can function by utilizing semiconductor characteristics, and a display device, a semiconductor circuit, and an electronic device are all included in the category of the semiconductor device. In addition, in this specification, a display device includes a light-emitting device and a liquid crystal display device in its category. The light-emitting device includes a light-emitting element, and the liquid crystal display device includes a liquid crystal element. A light-emitting element includes, in its category, an element whose luminance is controlled by current or voltage, and specifically includes an inorganic electroluminescent (EL) element, an organic EL element, an LED element, and the like.

When "B is formed on A" or "B is formed over A" is explicitly described in this specification, it does not necessarily mean that B is formed in direct contact with A. The description includes the case where A and B are not in direct contact with each other, i.e., the case where another object is interposed between A and B.

According to an embodiment of the present invention, a silicon layer is provided over and in contact with a surface of an oxide semiconductor layer in a transistor in which a channel layer is formed using an oxide semiconductor, whereby deterioration in electrical characteristics of the transistor can be suppressed.

BRIEF DESCRIPTION OF THE DRAWINGS

In the accompanying drawings:

FIGS. 13A to 13D illustrate an example of a manufacturing method of a semiconductor device according to Embodiment 5;

FIGS. 14A to 14C illustrate an example of a manufacturing method of a semiconductor device according to Embodiment 5;

FIGS. 22A and 22B illustrate an example of a semiconductor device according to Embodiment 8;

FIGS. 28A and 28B show diffusion coefficients of hydrogen obtained by simulation.

DETAILED DESCRIPTION OF THE INVENTION

Figure 1A:
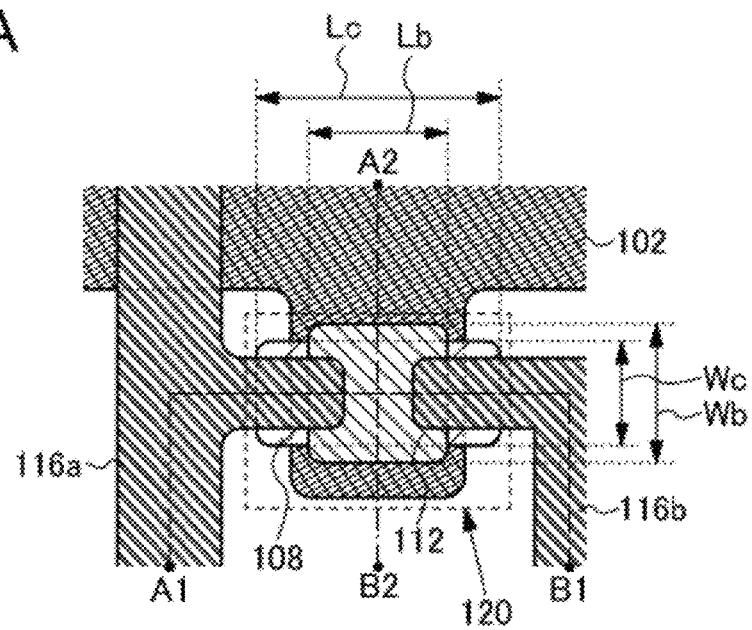
FIGS. 1A to 1C illustrate a structure of a transistor according to Embodiment 1.

Hereinafter, embodiments of the present invention will be described in detail with reference to the accompanying drawings. The present invention is not limited to the following description of the embodiments. It is easily understood by those skilled in the art that modes and details of the present invention can be changed in various ways without departing from the spirit and scope of the present invention. Therefore, the present invention is not construed as being limited to description of the embodiments below. Further, structures according to different embodiments can be implemented in combination as appropriate. In the structures of the invention described below, the same portions or portions having similar functions are denoted by the same reference numerals, and repetitive description thereof is omitted.

Embodiment 1

In this embodiment, an example of a structure of a transistor included in a semiconductor device will be described with reference to the drawings.

A transistor 120 illustrated in FIGS. 1A to 1C includes a gate (including a gate wiring and a gate electrode (hereinafter referred to as a "gate electrode 102")) provided over a substrate 100, a gate insulating layer 104 provided over the gate electrode 102, an oxide semiconductor layer 108 provided over the gate insulating layer 104, a silicon layer 112 provided over and in contact with a surface of the oxide semiconductor layer 108, and a source (including a source wiring and a source electrode (hereinafter referred to as a "source electrode layer 116a")) and a drain (including a drain wiring and a drain electrode (also referred to as a "drain electrode layer 116b")) which are electrically connected to the oxide semiconductor layer 108 (see FIGS. 1A to 1C).

Figure 1B:
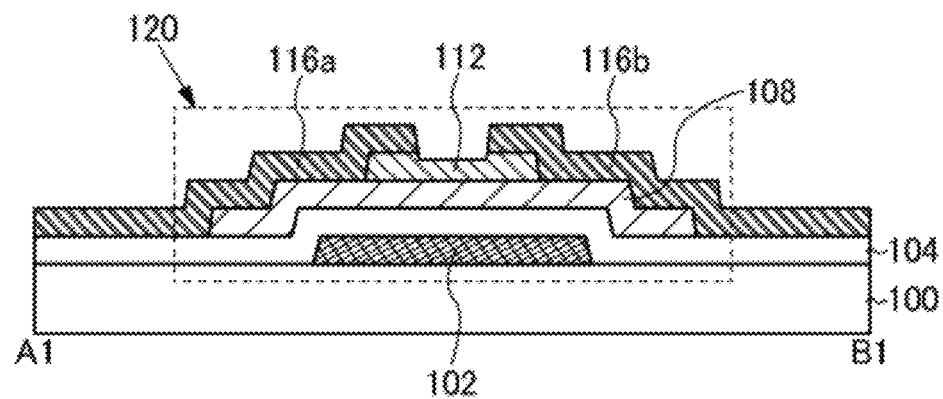
Figure 1C:
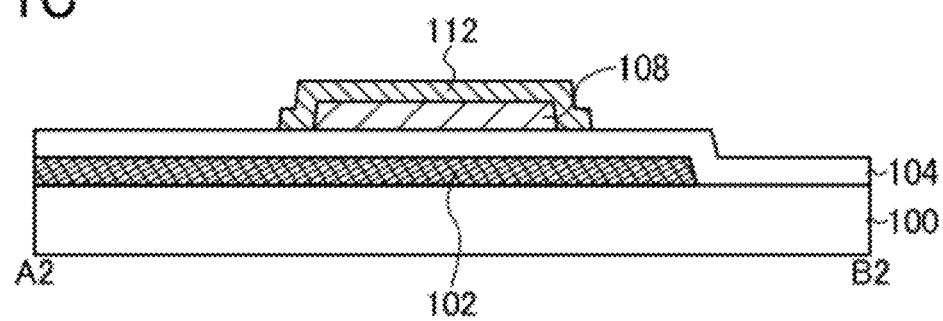

FIG. 1A is a top view, FIG. 1B is a cross-sectional view taken along line A1-B1 of FIG. 1A, and FIG. 1C is a cross-sectional view taken along line A2-B2 of FIG. 1A.

The oxide semiconductor layer 108 is provided so that at least part thereof overlaps with the gate electrode 102 with the gate insulating layer 104 interposed therebetween, and the oxide semiconductor layer 108 serves as a layer for forming a channel region of the transistor 120 (a channel layer).

An oxide material having semiconductor characteristics may be used for the oxide semiconductor layer 108. For example, an oxide semiconductor having a structure expressed by $InMO_3(ZnO)_m$ (m>0) can be used, and an In—Ga—Zn—O based oxide semiconductor is preferably used. Note that M represents one or more of metal elements selected from gallium (Ga), iron (Fe), nickel (Ni), manganese (Mn), and cobalt (Co). As well as the case where only Ga is contained as M, there is a case where Ga and any of the above metal elements except Ga, for example, Ga and Ni or Ga and Fe are contained as M. Moreover, in the oxide semiconductor, in some cases, a transition metal element such as Fe or Ni or an oxide of the transition metal is contained as an impurity element in addition to the metal element contained as M. In this specification, among the oxide semiconductors whose composition formulae are represented by $InMO_3 (ZnO)_m$ (m>0), an oxide semiconductor whose composition formula includes at least Ga as M is referred to as an In—Ga—Zn—O based oxide semiconductor, and a thin film of the In—Ga—Zn—O based oxide semiconductor is referred to as an In—Ga—Zn—O based non-single-crystal film.

As the oxide semiconductor which is applied to the oxide semiconductor layer 108, any of the following oxide semiconductors can be applied in addition to the above: an In—Sn—Zn—O based oxide semiconductor; an In—Al—Zn—O based oxide semiconductor; a Sn—Ga—Zn—O based oxide semiconductor; an Al—Ga—Zn—O based oxide semiconductor; a Sn—Al—Zn—O based oxide semiconductor; an In—Zn—O based oxide semiconductor; a Sn—Zn—O based oxide semiconductor; an Al—Zn—O based oxide semiconductor; an In—O based oxide semiconductor; a Sn—O based oxide semiconductor; and a Zn—O based oxide semiconductor.

The silicon layer 112 is provided over and in contact with the surface of the oxide semiconductor layer 108 at least in a region that overlaps with the gate electrode 102. In addition, the silicon layer 112 can be provided over and in contact with part of the surface of the oxide semiconductor layer 108, and the source electrode layer 116a and the drain electrode layer 116b can be provided in contact with regions of the oxide semiconductor layer 108, on which the silicon layer 112 is not provided. Here, an example where the regions of the oxide semiconductor layer 108, on which the silicon layer 112 is not provided, are provided apart from each other and the source electrode layer 116a and the drain electrode layer 116b are provided in contact with the regions is described.

Further, the silicon layer 112 is preferably formed using i-type (intrinsic) silicon. Note that the "i-type silicon" here means silicon which includes a p-type or n-type impurity element at a concentration of $1\times10^{17}$ atoms/cm$^3$ or less and oxygen and nitrogen each at a concentration of $1\times10^{20}$ atoms/cm$^3$ or less. Therefore, an impurity element such as phosphorus (P) or boron (B) may be included in this silicon within the above-described range. Note that the concentration of impurities included in the silicon layer 112 can be measured by secondary ion mass spectroscopy (SIMS).

As the crystal state of the silicon layer 112, amorphous silicon, microcrystalline silicon, or polycrystalline silicon (polysilicon) can be used. Note that the silicon layer 112 may include two or more crystal structures among the above crystal structures (e.g., the amorphous structure and the microcrystalline structure (or the polycrystalline structure)).

As a formation method of the silicon layer 112, a CVD method, a sputtering method, an evaporation method, a coating method, or the like can be used. The thickness of the silicon layer 112 can be set to be greater than or equal to 1 nm and less than or equal to 500 nm, preferably greater than or equal to 10 nm and less than or equal to 100 nm.

For example, the silicon layer 112 is formed by a sputtering method in an atmosphere which does not include hydrogen or an atmosphere which includes a small amount of hydrogen such as an argon atmosphere, whereby the concentration of hydrogen contained in the silicon layer 112 can be reduced. Accordingly, variation in semiconductor characteristics of the oxide semiconductor layer 108 due to hydrogen contained in the silicon layer 112 can be reduced.

In the case of forming the silicon layer 112 by a sputtering method, a direct current (DC) sputtering apparatus (including a pulsed DC sputtering apparatus which applies a bias in a pulsed manner) is preferably used. The DC sputtering apparatus can deal with a substrate with larger size as compared to an RF sputtering apparatus. This is a great advantage as compared to the case of using an insulating layer such as a silicon oxide layer or a silicon nitride layer as a protective layer, because RF sputtering, which has difficulty in processing a large-sized substrate, needs to be used in the case of forming an insulating layer such as a silicon oxide layer or a silicon nitride layer by a sputtering method (in the case of using an insulator as a target).

In the case of forming the silicon layer 112 with a DC sputtering apparatus, a silicon target or a silicon target into which an impurity such as boron is added can be used.

As illustrated in FIGS. 1A to 1C, the silicon layer 112 is provided in contact with the back channel side (the surface on the opposite side from the gate electrode 102) of the oxide semiconductor layer 108, whereby the silicon layer 112 serves as a protective film and entry of hydrogen or the like to the oxide semiconductor layer 108 can be suppressed. As a result, variation in semiconductor characteristics of the oxide semiconductor layer 108 due to entry of an element such as hydrogen can be suppressed; accordingly, variation and deterioration in electrical characteristics of a transistor which uses the oxide semiconductor layer 108 as a channel layer can be suppressed.

In the case where the source electrode layer 116a and the drain electrode layer 116b are provided over the oxide semiconductor layer 108, the silicon layer 112 can serve as a channel protective layer (a channel stop layer). As compared to the case where the silicon layer 112 is not provided in contact with the oxide semiconductor layer 108 (channel-etch type), variation in characteristics caused by exposure of the oxide semiconductor layer 108 can be suppressed. In the case where the silicon layer 112 is made to actively serve as a channel protective layer, the silicon layer 112 is preferably formed dense. For example, the silicon layer 112 can be formed dense by a CVD method.

The silicon layer 112 may be provided in contact with a surface of at least a region in which a channel is formed in the oxide semiconductor layer 108. In addition, a silicon oxide film, a silicon oxynitride film, a silicon nitride film, or a silicon nitride oxide film may be formed over the silicon layer 112. An insulating film provided over the silicon layer 112 may be formed by film formation using a sputtering method or a CVD method or by oxidation (including natural oxidation) or nitridation of a surface of the silicon layer 112. The surface of the silicon layer 112 can be oxidized or nitrided by plasma treatment in an oxygen atmosphere or a nitrogen atmosphere.

Further, in FIGS. 1A to 1C, the source electrode layer 116a serves as a source of the transistor 120, and the drain electrode layer 116b serves as a drain of the transistor 120. Depending on the driving method of the transistor 120, the source electrode layer 116a might serve as a drain and the drain electrode layer 116b might serve as a source.

In the structure illustrated in FIGS. 1A to 1C, germanium, silicon germanium produced by adding germanium in silicon, or silicon carbide (SiC), as well as silicon, may be used as a material provided in contact with the surface of the oxide semiconductor layer 108.

Next, the effectiveness of the oxide semiconductor layer provided in contact with the silicon layer will be described based on simulation with a calculator. Here, the effectiveness of amorphous silicon (a-Si) and amorphous silicon oxide (a-SiO$_2$) for blocking hydrogen was researched.

<Calculation Method>

First, motion of atoms was tracked by numerically solving equations of motion for each atom by classical molecular dynamics simulation where the temperature T was set at 27° C. and the pressure P was set at 1 atm. With the use of mean-square displacement of H atoms obtained from the calculation results, the diffusion coefficient D of H atoms was calculated from Einstein's relation (Formula I). As the diffusion coefficient D is larger, diffusion is more likely to be caused.

$$\lim_{t \to \infty} \left\langle \frac{1}{N} \sum_{i=1}^{N} |r_i(t) - r_i(0)|^2 \right\rangle_t = 6Dt \quad (1)$$

$\left\langle \frac{1}{N} \sum_{i=1}^{N} |r_i(t) - r_i(0)|^2 \right\rangle_t$ : Mean-Square Displacement of H atoms $N$: Number of H Atoms $r_i(t)$: Position of $i$-th H atom at Time $t$ $\langle \ \rangle_t$: Temporal Mean <Calculation Model and Calculation Conditions>

Figure 27A:
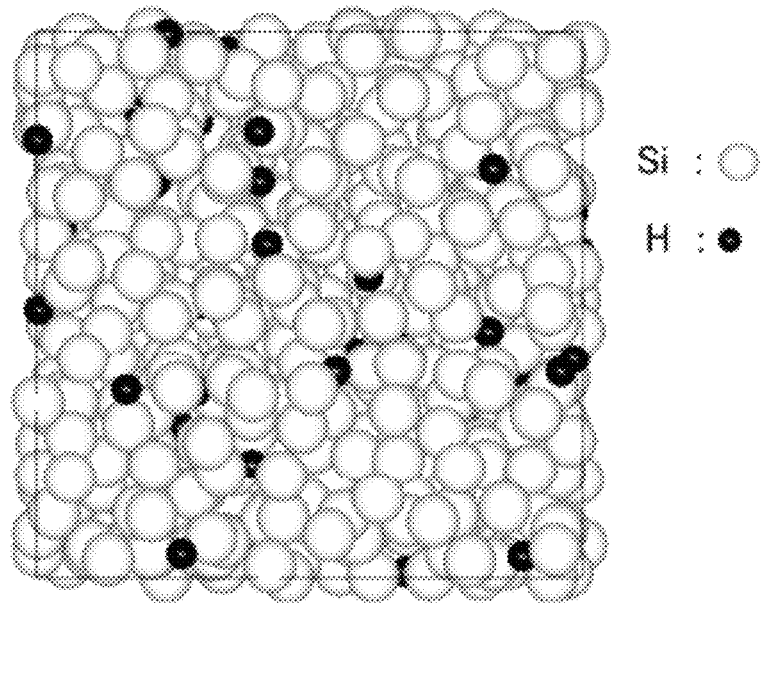
FIGS. 27A and 27B illustrate models which are used in simulation.
Figure 27B:
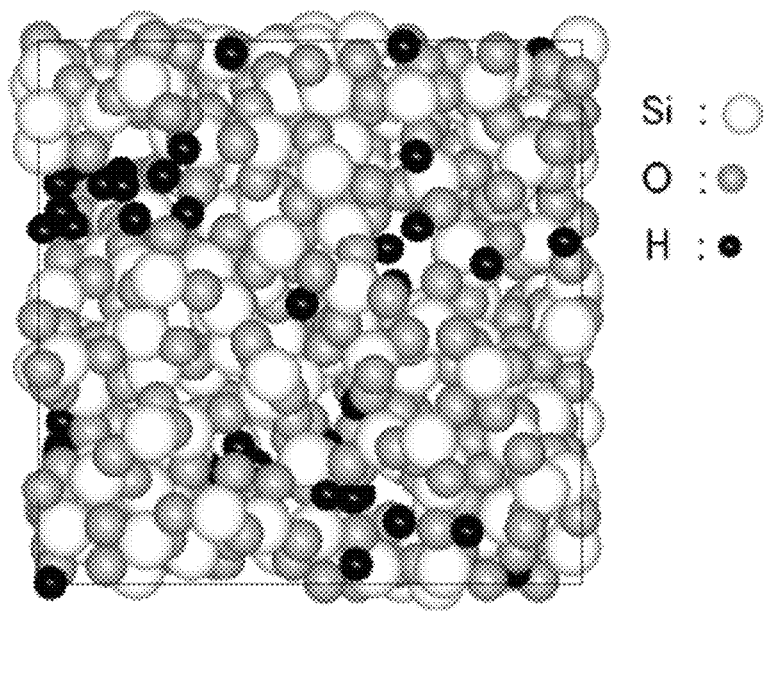

An a-Si:H model in which 60H atoms (10 atom %) are added into 540 a-Si atoms (see FIG. 27A) and an a-SiO$_2$:H model in which 60H atoms (10 atom %) are added into 540 a-SiO$_2$ atoms (see FIG. 27B) were prepared. Here, three-dimensional periodic boundary conditions are used, which allows calculation of a bulk.

An empirical potential which characterizes the interaction between atoms is defined in the classical molecular dynamics method which is used in this calculation, so that force that acts on each atom is evaluated. For the a-Si:H model, a Tersoff potential was used. For a-SiO$_2$ of the a-SiO$_2$:H model, a Born-Mayer-Huggins potential and a Morse potential were used, and for the interaction between a-SiO$_2$ and a hydrogen atom (between a silicon atom and a hydrogen atom and between an oxygen atom and a hydrogen atom), a Lennard-Jones potential was used. As a calculation program, a simulation software "Materials Explorer 5.0", which is manufactured by Fujitsu Limited, was used.

Classical molecular dynamics simulation was performed on each calculation model under the conditions where the temperature T was set at 27° C., the pressure P was set at 1 atm, and the time was set at 1 nsec (time step: 0.2 fsec×5 million steps).

<Calculation Results and Consideration>

The mean-square displacement of H atoms in a-Si and the mean-square displacement of H atoms in a-SiO$_2$, which were obtained from the calculation, are shown in FIG. 28A. FIG.

28B shows the diffusion coefficients D of H atoms in the calculation models, each of which are obtained from the region where the slope in the graph of FIG. 28A is substantially constant (70 psec to 100 psec). From FIG. 28B, it was found that the diffusion coefficient of H atoms in a-Si is smaller than that of H atoms in a-SiO$_2$ and H atoms in a-Si are less likely to be diffused than H atoms in a-SiO$_2$. In other words, it seems that an a-Si film has a high effect of preventing entry of hydrogen as compared to an a-SiO$_2$ film.

Next, the shapes of the oxide semiconductor layer 108 and the silicon layer 112 in the structure illustrated in FIGS. 1A to 1C will be described. Note that in the description below, the width of the silicon layer 112 (Wb) and the width of the oxide semiconductor layer 108 (Wc) indicate the length of the silicon layer 112 and the length of the oxide semiconductor layer 108 in the channel width direction, respectively. Further, the length of the silicon layer 112 (Lb) and the length of the oxide semiconductor layer 108 (Lc) indicate the length of the silicon layer 112 and the length of the oxide semiconductor layer 108 in the channel length direction, respectively. Furthermore, the channel length direction indicates the direction which is generally parallel to the direction in which carriers move in the transistor 120 (the direction in which the source electrode layer 116a and the drain electrode layer 116b are connected to each other), and the channel width direction indicates the direction which is generally perpendicular to the channel length direction.

The transistor illustrated in FIGS. 1A to 1C is a transistor in the case where the width of the silicon layer 112 (Wb) is larger than the width of the oxide semiconductor layer 108 (Wc) and the silicon layer 112 is provided to extend beyond (to cross) both edges of the oxide semiconductor layer 108 in the channel width direction. In addition, the length of the silicon layer 112 (Lb) is smaller than the length of the oxide semiconductor layer 108 (Lc). Further, two regions which are not covered with the silicon layer 112 are provided in the channel length direction, and the source electrode layer 116a and the drain electrode layer 116b are provided in the two regions that are apart from each other so as to be electrically connected. In this manner, leakage current caused by change in semiconductor characteristics of the surface of the oxide semiconductor layer 108 can be reduced.

The structure of the transistor of this embodiment is not limited to the one illustrated in FIGS. 1A to 1C.

Figure 3A:
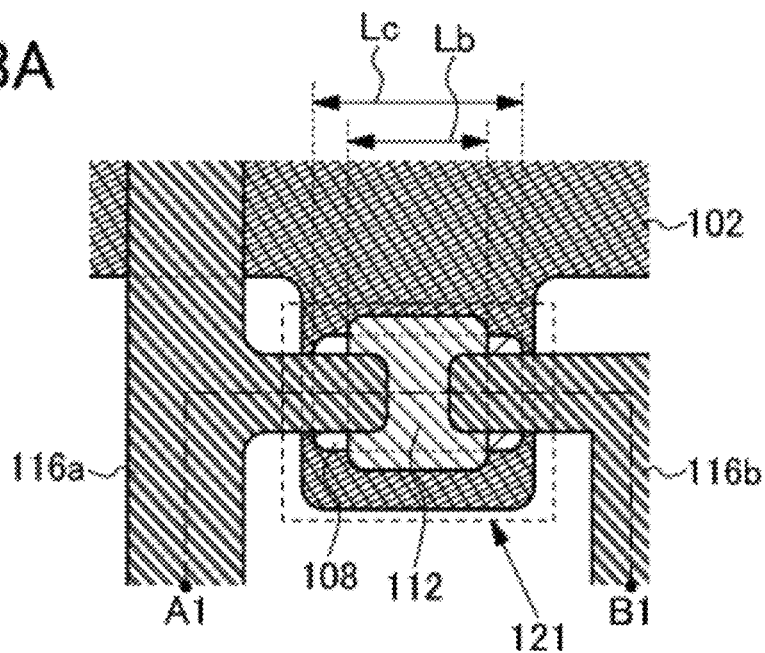
FIGS. 3A and 3B illustrate a structure of a transistor according to Embodiment 1.
Figure 3B:
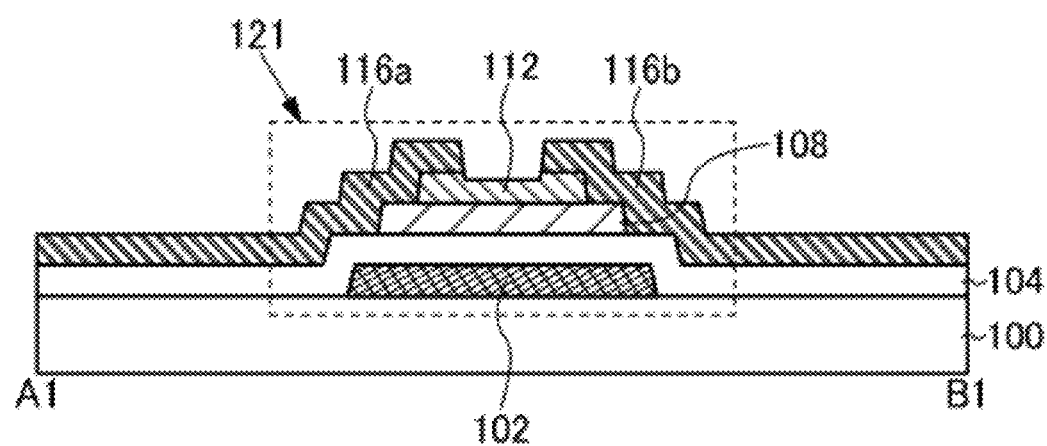

FIGS. 1A to 1C illustrate the transistor 120 in which the length of the oxide semiconductor layer 108 (Lc) is made large so that the oxide semiconductor layer 108 extends beyond edges of the gate electrode 102 in the channel length direction; however, as in a transistor 121 illustrated in FIGS. 3A and 3B, the length of the oxide semiconductor layer 108 (Lc) may be made small and the whole region of the oxide semiconductor layer 108 may be located over the gate electrode 102. Note that FIG. 3A is a top view and FIG. 3B is a cross-sectional view taken along line A1-B1 of FIG. 3A.

Figure 4A:
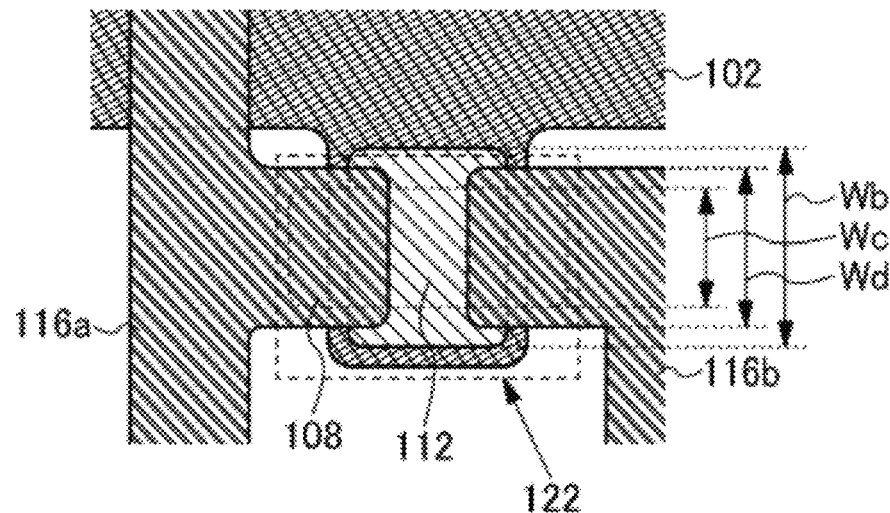
FIGS. 4A and 4B each illustrate a structure of a transistor according to Embodiment 1.
Figure 4B:
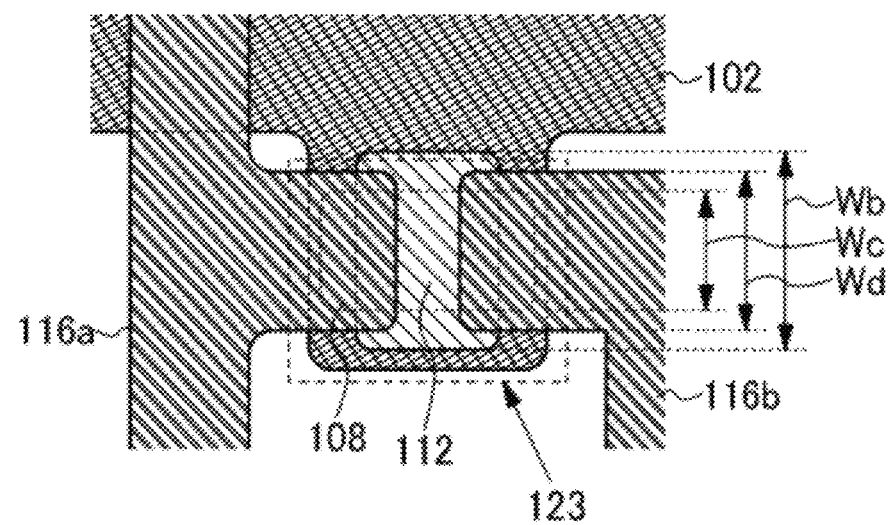

In the structures of FIGS. 1A to 1C and FIGS. 3A and 3B, the widths of the source electrode layer 116a and the drain electrode layer 116b (Wd) may each be larger than the width of the oxide semiconductor layer 108 (Wc) in regions where the source electrode layer 116a and the drain electrode layer 116b overlap with the oxide semiconductor layer 108 (see FIGS. 4A and 4B). In a transistor 122 and a transistor 123 illustrated in FIGS. 4A and 4B respectively, regions of the oxide semiconductor layer 108, which the silicon layer 112 is not in contact with, can be covered with the source electrode layer 116a and the drain electrode layer 116b; accordingly, there is an advantage that the oxide semiconductor layer 108 is protected and thereby reliability is improved. Further, contact resistance between the oxide semiconductor layer 108 and the source and drain electrode layers 116a and 116b can be reduced by the increase in the contact area between the oxide semiconductor layer 108 and the source and drain electrode layers 116a and 116b.

The widths of the source electrode layer 116a and the drain electrode layer 116b (Wd) indicate the lengths of the source electrode layer 116a and the drain electrode layer 116b in the channel width direction.

The widths of the source electrode layer 116a and the drain electrode layer 116b (Wd) may be larger than the width of the silicon layer 112 (Wb). Alternatively, only one of the widths of the source electrode layer 116a and the drain electrode layer 116b (Wd) may be larger than the width of the oxide semiconductor layer 108 (Wc) (or the width of the silicon layer 112 (Wb)).

In the structures described in this embodiment, a light-blocking portion such as a black matrix may be provided above and/or below the silicon layer 112 to shield the silicon layer 112 from light. In this case, variation in electrical characteristics of a transistor due to irradiation of the silicon layer 112 with light can be suppressed. In the case where the gate electrode 102 is formed using a light-blocking material, a light-blocking portion such as a black matrix may be provided over the silicon layer 112 (on the opposite side from the gate electrode 102).

Next, an example of a manufacturing method of the transistor illustrated in FIGS. 1A to 1C will be described with reference to FIGS. 2A to 2F.

First, the gate electrode 102 is formed over the substrate 100 and the gate insulating layer 104 is formed over the gate electrode 102. Then, an oxide semiconductor layer 106 is formed over the gate insulating layer 104 (see FIG. 2A).

A substrate having an insulating surface may be used as the substrate 100, and for example, a glass substrate can be used. Alternatively, as the substrate 100, an insulating substrate formed using an insulator such as a ceramic substrate, a quartz substrate, or a sapphire substrate; a semiconductor substrate which is formed using a semiconductor material such as silicon and whose surface is covered with an insulating material; or a conductive substrate which is formed using a conductor such as metal or stainless steel and whose surface is covered with an insulating material can be used. Further alternatively, a plastic substrate can be used as long as it can withstand heat treatment in a manufacturing process.

The gate electrode 102 can be formed in the following manner: after a conductive film is formed over an entire surface of the substrate 100, the conductive film is etched by a photolithography method.

The gate electrode 102 can be formed using a conductive material such as aluminum (Al), copper (Cu), molybdenum (Mo), tungsten (W), titanium (Ti), or the like. Note that when aluminum is used alone for the wiring or the electrode, there are problems in that aluminum has low heat resistance and that aluminum is easily eroded, for example. Therefore, it is preferable to use aluminum in combination with a heat-resistant conductive material.

As the heat-resistant conductive material, an element selected from titanium (Ti), tantalum (Ta), tungsten (W), molybdenum (Mo), chromium (Cr), neodymium (Nd), and scandium (Sc); an alloy containing the above element as its component; an alloy containing a combination of the above elements; or a nitride containing the above element as its component may be used. A film formed using any of these heat-resistant conductive materials and an aluminum (or copper) film may be stacked, so that the wiring and the electrode may be formed.

The gate electrode 102 may be formed using a material having high conductivity and a light-transmitting property to visible light. As such a material, indium tin oxide (ITO), indium tin oxide containing silicon oxide (ITSO), organoindium, organotin, zinc oxide (ZnO), or the like can be used, for example.

The gate insulating layer 104 can be formed using a silicon oxide film, a silicon oxynitride film, a silicon nitride film, a silicon nitride oxide film, an aluminum oxide film, a tantalum oxide film, or the like. Further, any of these films may be stacked. For example, any of these films can be formed by a sputtering method or the like with a thickness of greater than or equal to 10 nm and less than or equal to 500 nm.

The oxide semiconductor layer 106 can be formed using an In—Ga—Zn—O based oxide semiconductor. In this case, the oxide semiconductor layer 106 having an amorphous structure can be formed by a sputtering method using an oxide semiconductor target including In, Ga, and Zn (e.g., $In_2O_3$:$Ga_2O_3$:ZnO=1:1:1).

For example, the conditions of the sputtering method can be set as follows: the distance between the substrate 100 and the target is 30 mm to 500 mm inclusive, the pressure is 0.01 Pa to 2.0 Pa inclusive, the direct current (DC) power supply is 0.25 kW to 5.0 kW inclusive, the temperature is 20° C. to 200° C. inclusive, the atmosphere is an argon atmosphere, an oxygen atmosphere, or a mixed atmosphere of argon and oxygen.

Note that a pulse direct current (DC) power supply is preferable in a sputtering method because dust can be reduced and the film thickness can be uniform. The thickness of the oxide semiconductor layer 106 can be set to greater than or equal to 5 nm and less than or equal to 200 nm.

In the case where an In—Ga—Zn—O based non-single-crystal film is formed as the oxide semiconductor layer 106, an insulating impurity may be contained in the oxide semiconductor target including In, Ga, and Zn. The impurity is an insulating oxide typified by silicon oxide, germanium oxide, aluminum oxide, or the like; an insulating nitride typified by silicon nitride, aluminum nitride, or the like; or an insulating oxynitride such as silicon oxynitride or aluminum oxynitride. Any of these insulating oxides and insulating nitrides is added at a concentration at which electrical conductivity of the oxide semiconductor does not deteriorate.

When the oxide semiconductor layer 106 contains an insulating impurity, crystallization of the oxide semiconductor layer 106 can be suppressed, which enables stabilization of characteristics of the thin film transistor. Further, in the case where an impurity such as silicon oxide is contained in the In—Ga—Zn—O based oxide semiconductor, crystallization of the oxide semiconductor or generation of microcrystal grains can be prevented even through heat treatment at 200° C. to 600° C. inclusive.

As the oxide semiconductor which is applied to the oxide semiconductor layer 106, any of the following oxide semiconductors can be applied in addition to the above: an In—Sn—Zn—O based oxide semiconductor, an In—Al—Zn—O based oxide semiconductor, an Sn—Ga—Zn—O based oxide semiconductor, an Al—Ga—Zn—O based oxide semiconductor, an Sn—Al—Zn—O based oxide semiconductor, an In—Zn—O based oxide semiconductor, an Sn—Zn—O based oxide semiconductor, an Al—Zn—O based oxide semiconductor, an In—O based oxide semiconductor, an Sn—O based oxide semiconductor, and a Zn—O based oxide semiconductor. Further, by addition of an impurity which suppresses crystallization to keep an amorphous state to these oxide semiconductors, characteristics of the thin film transistor can be stabilized. As the impurity, an insulating oxide typified by silicon oxide, germanium oxide, aluminum oxide, or the like; an insulating nitride typified by silicon nitride, aluminum nitride, or the like; or an insulating oxynitride such as silicon oxynitride or aluminum oxynitride is applied.

Figure 2A:
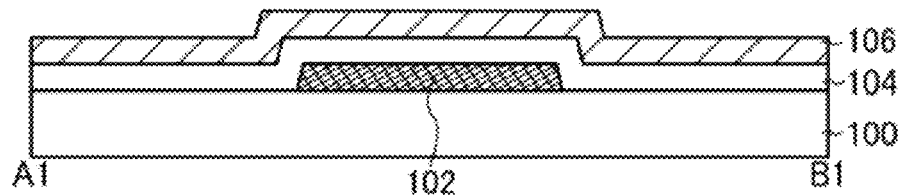
FIGS. 2A to 2F illustrate an example of a manufacturing method of a thin film transistor according to Embodiment 1.
Figure 2B:
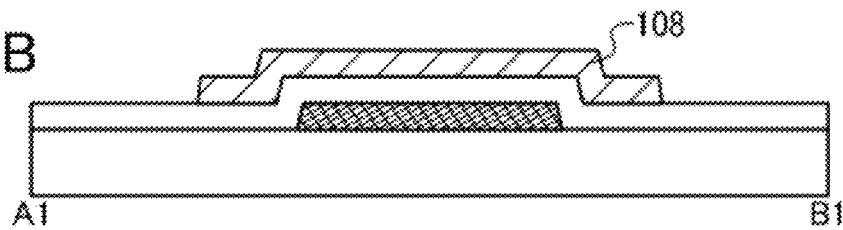

Next, the oxide semiconductor layer 106 is etched to form the island-shaped oxide semiconductor layer 108 (see FIG. 2B). At this time, the oxide semiconductor layer 106 is etched so that the island-shaped oxide semiconductor layer 108 remains at least above the gate electrode 102.

Figure 2C:
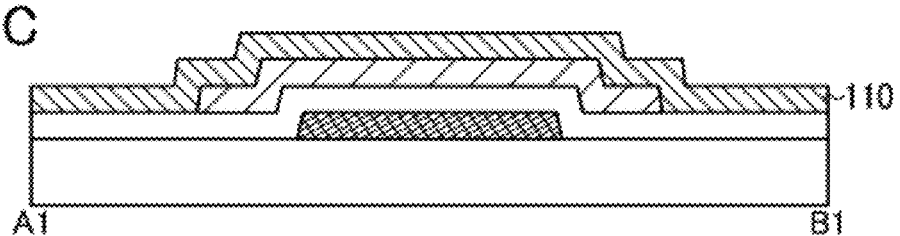

Then, a silicon layer 110 is formed so as to cover the oxide semiconductor layer 108 (see FIG. 2C).

The silicon layer 110 can be formed by a sputtering method. In this case, the silicon layer 110 can be formed by a DC sputtering method using a silicon target or a silicon target to which boron is added, in an argon atmosphere. However, without limitation to this, the silicon layer 110 may be formed by a CVD method or the like. Depending on the film formation conditions, there is a case where a mixed layer of the oxide semiconductor layer 108 and the silicon layer 110 (e.g., an oxide of silicon or the like) is formed thin at an interface between the oxide semiconductor layer 108 and the silicon layer 110.

Figure 2D:
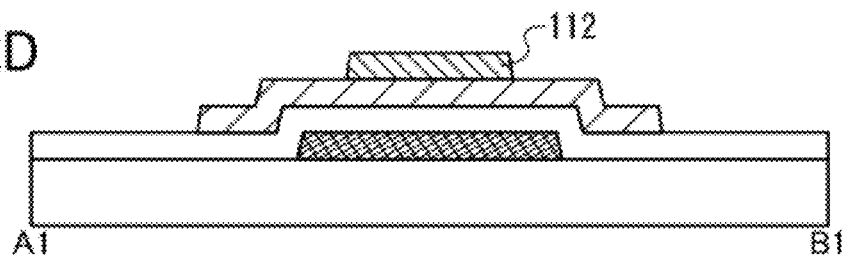

Next, the silicon layer 110 is etched to form the island-shaped silicon layer 112 (see FIG. 2D). At this time, the silicon layer 110 is etched so that the island-shaped silicon layer 112 remains at least in a region that overlaps with the gate electrode 102. In addition, the etching of the silicon layer 110 is performed so as to expose at least part of the oxide semiconductor layer 108.

As the etching, wet etching with the use of tetramethylammonium hydroxide (TMAH) can be applied. In this case, etching selectivity of the silicon layer 110 with respect to the oxide semiconductor layer 108 is high and the silicon layer 110 can be favorably etched while the oxide semiconductor layer 108 is hardly etched. Further, damage to the oxide semiconductor layer 108 can be reduced.

Note that etching selectivity shows, for example in the case of etching a layer A and a layer B, the difference between etching rates of the layer A and the layer B. Accordingly, a high etching selectivity means that there is a sufficient difference between the etching rates.

Figure 2E:
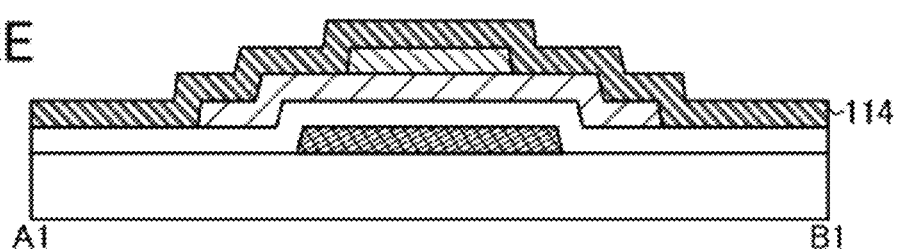

Next, a conductive film 114 is formed over the gate insulating layer 104, the oxide semiconductor layer 108, and the silicon layer 112 (see FIG. 2E).

The conductive film 114 can be formed by a sputtering method, a vacuum evaporation method, or the like using metal including an element selected from aluminum (Al), copper (Cu), titanium (Ti), tantalum (Ta), tungsten (W), molybdenum (Mo), chromium (Cr), neodymium (Nd), and scandium (Sc); an alloy including the above element as a component; or a material including a nitride or the like in which the above element is included.

For example, the conductive film 114 can be formed to have a single-layer structure of a molybdenum film or a titanium film. The conductive film 114 may be formed to have a stacked structure and, for example, can be formed to have a stacked structure of an aluminum film and a titanium film. Alternatively, a three-layer structure in which a titanium film, an aluminum film, and a titanium film are sequentially stacked may be used. A three-layer structure in which a molybdenum film, an aluminum film, and a molybdenum film are sequentially stacked may be used. As the aluminum films used for these stacked structures, an aluminum film including neodymium (Al—Nd) may be used. Further alternatively, the conductive film 114 may be formed to have a single-layer structure of an aluminum film including silicon.

The conductive film 114 may be formed using a material having high conductivity and a light-transmitting property to visible light. As such a material, indium tin oxide (ITO), indium tin oxide containing silicon oxide (ITSO), organoindium, organotin, zinc oxide (ZnO), or the like can be used for example.

Figure 2F:
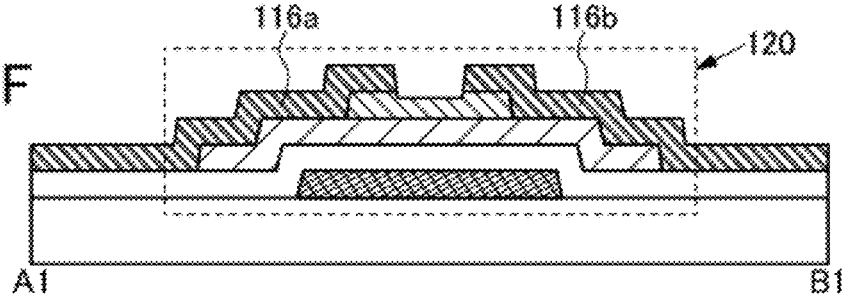

Next, the conductive film 114 is etched to form the source electrode layer 116a and the drain electrode layer 116b (see FIG. 2F). At this time, depending on the etching conditions, the silicon layer 112 might also be etched and reduced in thickness at the time of etching of the conductive film 114. Here, a case where the silicon layer 112 is also etched and reduced in thickness at the time of etching of the conductive film 114 is described.

In the above-described step, the silicon layer 112 serves as a channel protective layer (a channel stop layer) which suppresses etching of the oxide semiconductor layer 108 when the conductive film 114 is etched. In some cases, the oxide semiconductor layer 108 is reduced in thickness at the time of etching of the conductive film 114 in a region over which the silicon layer 112 is not provided.

Thus, by providing the silicon layer 112 in contact with the oxide semiconductor layer 108, entry of an unintended element such as hydrogen to the oxide semiconductor layer 108 from the outside can be suppressed.

Through the above-described process, the transistor 120 can be manufactured.

Further, a protective insulating layer may be formed so as to cover the transistor 120. For example, a single layer or a stacked layer of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a CVD method, a sputtering method, or the like as the protective insulating layer. Further, after the source electrode layer 116a and the drain electrode layer 116b are formed, the exposed portion of the silicon layer 112 may be oxidized (including natural oxidation) or nitrided to form a silicon oxide film, a silicon nitride film, a silicon oxynitride film, or a silicon nitride oxide film in a region over the silicon layer 112, which is located between the source electrode layer 116a and the drain electrode layer 116b.

In the process of FIGS. 2A to 2F, after formation of the oxide semiconductor layer 108, it is preferable to perform heat treatment at 100° C. to 600° C. inclusive, typically 200° C. to 400° C. inclusive in a nitrogen atmosphere or an air atmosphere. For example, heat treatment can be performed at 350° C. in a nitrogen atmosphere for 1 hour. This heat treatment is important because the heat treatment causes rearrangement at the atomic level of the island-shaped oxide semiconductor layer 108 and distortion that interrupts carrier movement in the oxide semiconductor layer 108 can be reduced.

There is no particular limitation on the timing of the heat treatment as long as it is performed after the formation of the oxide semiconductor layer 106, and the heat treatment may be performed after the formation of the silicon layer 110, the formation of the island-shaped silicon layer 112, the formation of the conductive film 114, the formation of the source electrode layer 116a and the drain electrode layer 116b, or the formation of the protective insulating layer. Depending on the conditions or the like of the heat treatment, a mixed layer of the oxide semiconductor layer 108 and the silicon layer 112 (e.g., an oxide of silicon or the like) might be formed thin at an interface between the oxide semiconductor layer 108 and the silicon layer 112.

Then, various electrodes and wirings are formed, whereby a semiconductor device including the transistor 120 is completed.

The case where the silicon layer 110 is formed after the oxide semiconductor layer 108 is formed is illustrated in FIGS. 2A to 2F. However, after the oxide semiconductor layer 106 and the silicon layer 110 are formed in succession so as to be stacked, they may be patterned into the oxide semiconductor layer 108 and the silicon layer 112, respectively, with a plurality of masks. A manufacturing method in this case will be described with reference to FIGS. 25A to 25E.

First, the gate electrode 102 is formed over the substrate 100, and then the gate insulating layer 104 is formed over the gate electrode 102. Then, the oxide semiconductor layer 106 and the silicon layer 110 are sequentially formed to be stacked over the gate insulating layer 104, and a resist mask 175 is selectively formed (see FIG. 25A). It is preferable that layers of from the gate insulating layer 104 to the silicon layer 110, or from the oxide semiconductor layer 106 to the silicon layer 110 be formed in succession.

Figure 25A:
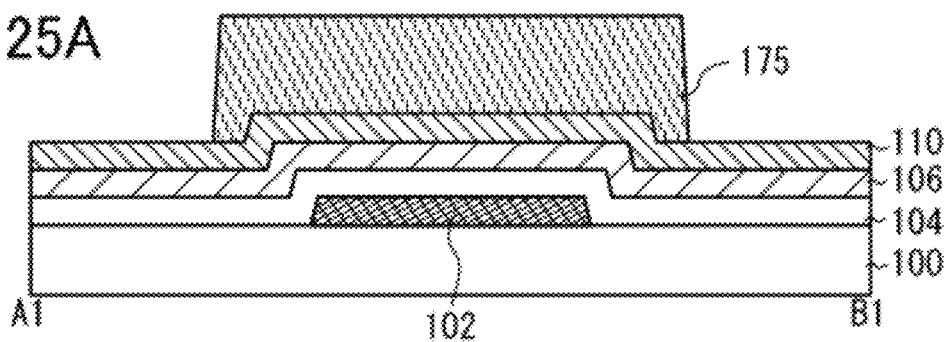
FIGS. 25A to 25E illustrate an example of a manufacturing method of a transistor according to Embodiment 1.
Figure 25B:
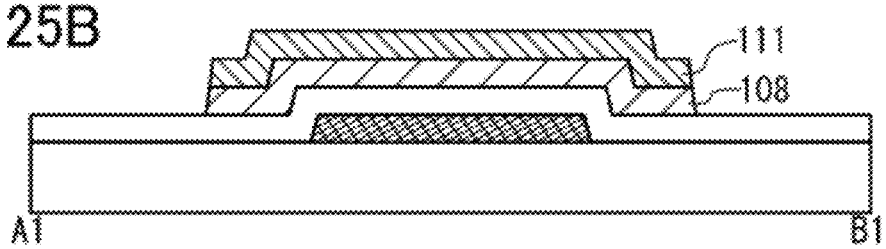

Next, unnecessary portions of the silicon layer 110 and the oxide semiconductor layer 106 are etched using the resist mask 175, so that the island-shaped oxide semiconductor layer 108 and the silicon layer 111 are formed (see FIG. 25B). Then, the resist mask 175 is removed.

Figure 25C:
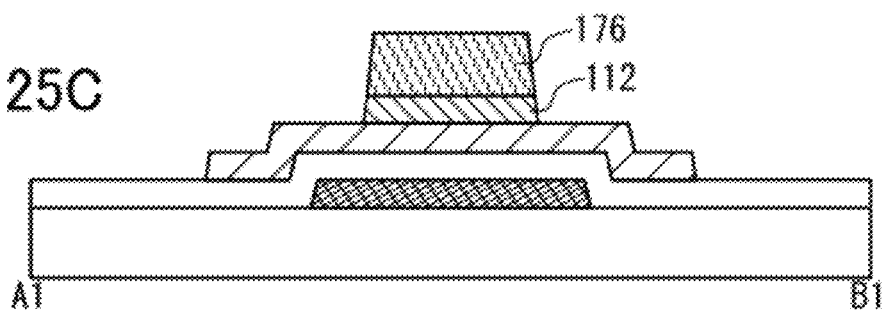
Figure 25D:
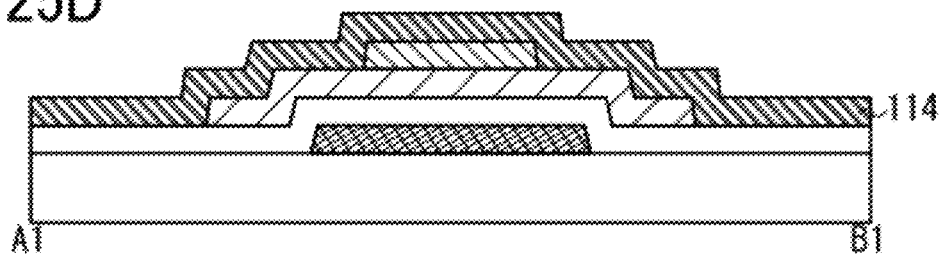

Then, a resist mask 176 is formed over the silicon layer 111, and the exposed silicon layer 111 is etched using the resist mask 176; thus, the island-shaped silicon layer 112 is formed (see FIG. 25C).

Figure 25E:
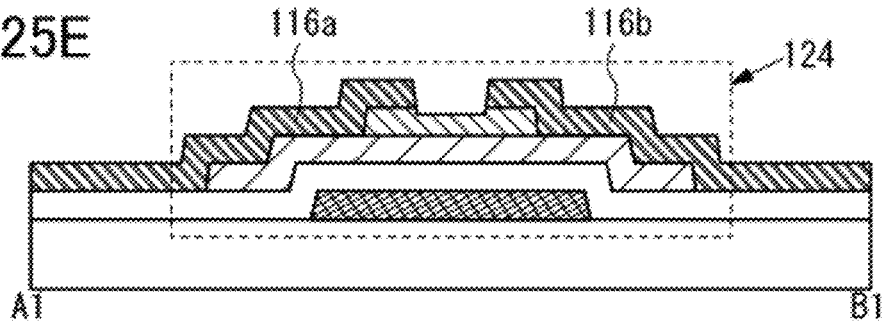

Next, after forming the conductive film 114 over the gate insulating layer 104, the oxide semiconductor layer 108, and the silicon layer 112 (see FIG. 25D), the conductive film 114 is etched to form the source electrode layer 116a and the drain electrode layer 116b (see FIG. 25E).

Figure 26A:
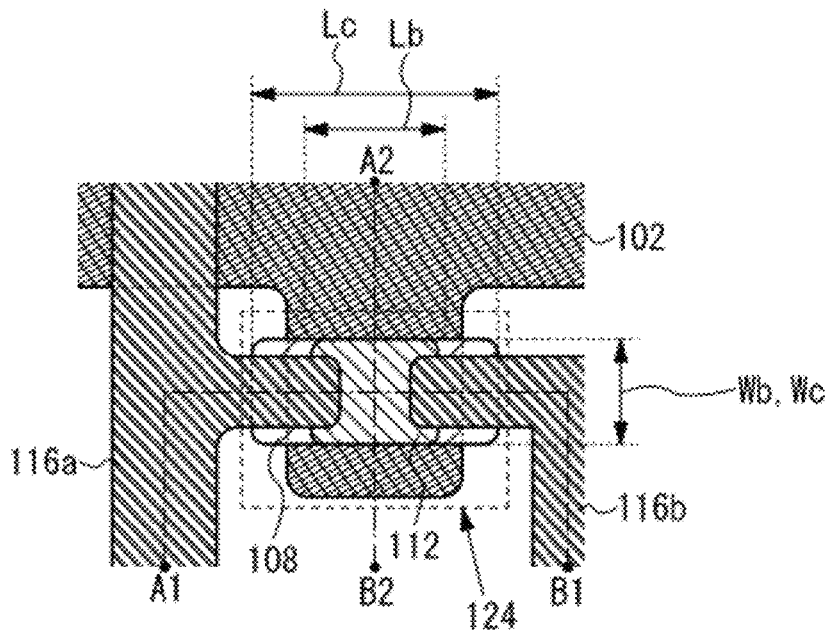
FIGS. 26A to 26C illustrate a structure of a transistor according to Embodiment 1.
Figure 26B:
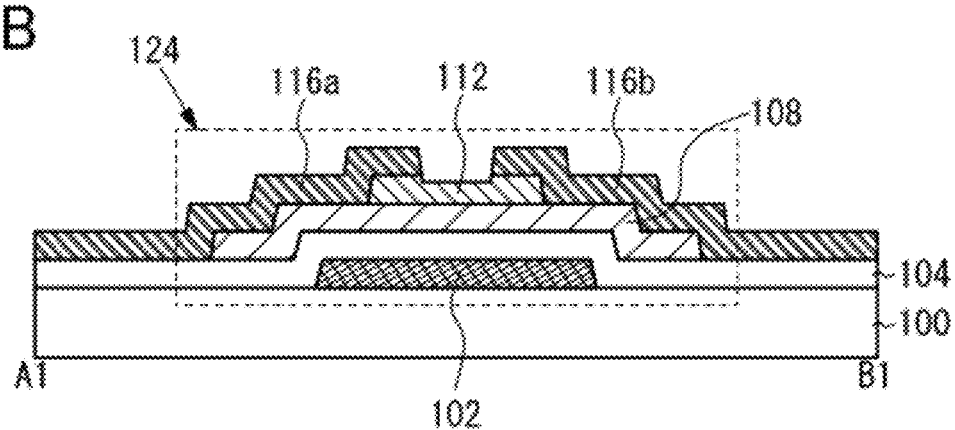
Figure 26C:
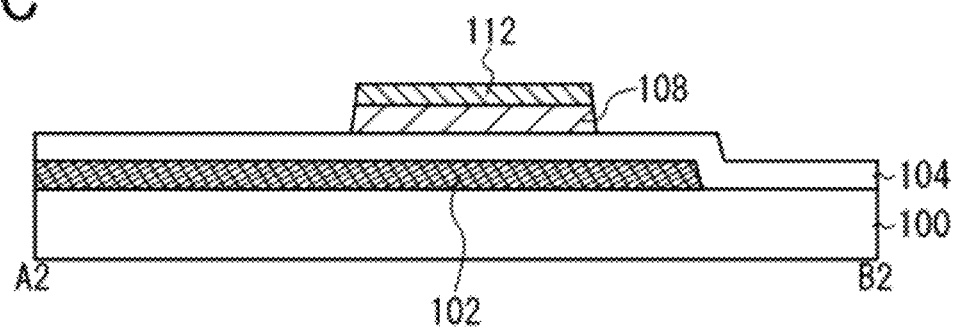

Through the above-described process, a transistor 124 as illustrated in FIGS. 26A to 26C can be manufactured. FIGS. 26A to 26C illustrate the transistor 124 in the case where the width of the silicon layer 112 (Wb) and the width of the oxide semiconductor layer 108 (Wc) are equal. FIG. 26A is a top view, FIG. 26B is a cross-sectional view taken along line A1-B1 of FIG. 26A, and FIG. 26C is a cross-sectional view taken along line A2-B2 of FIG. 26A.

By forming the oxide semiconductor layer 106 and the silicon layer 110 in succession in this manner, damage to the surface of the oxide semiconductor layer 106 due to an etchant, plasma, or the like can be reduced.

This embodiment can be implemented in combination with any of the other structures described in other embodiments, as appropriate.

Embodiment 2

In this embodiment, a structure and a manufacturing method of a transistor which is different from that of Embodiment 1 will be described with reference to the drawings.

First, the manufacturing method of the transistor will be described with reference to FIGS. 5A to 5E. Note that the manufacturing process (such as applicable materials) described in this embodiment is in common with that of Embodiment 1 in many points. Thus, description of the common points is omitted below and only points different from those of Embodiment 1 will be described in detail.

First, a gate electrode 102 is formed over a substrate 100, and then a gate insulating layer 104 is formed over the gate electrode 102. Then, an oxide semiconductor layer 106 and a silicon layer 110 are sequentially formed to be stacked over the gate insulating layer 104, and a resist mask 171 is selectively formed (see FIG. 5A). It is preferable that layers of from the gate insulating layer 104 to the silicon layer 110, or from the oxide semiconductor layer 106 to the silicon layer 110 be formed in succession.

Figure 5A:
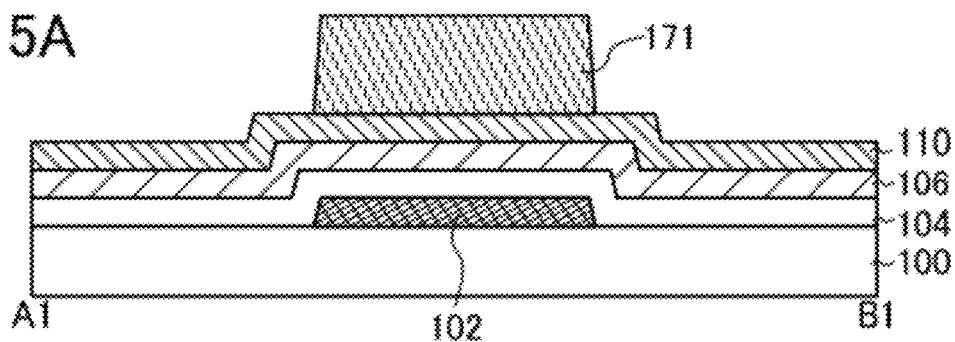
FIGS. 5A to 5E illustrate an example of a manufacturing method of a transistor according to Embodiment 2.
Figure 5B:
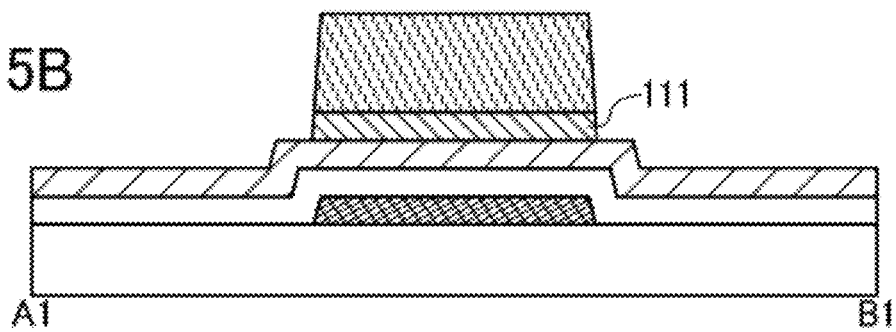

Next, the silicon layer 110 is etched using the resist mask 171, so that an island-shaped silicon layer 111 is formed (see FIG. 5B). Here, wet etching with the use of an alkaline etchant is performed. When an alkaline etchant is used, etching selectivity of the silicon layer 110 with respect to the oxide semiconductor layer 106 is high and the silicon layer 110 can be selectively etched. As the alkaline etchant, tetramethylammonium hydroxide (TMAH) can be used, for example.

Figure 5C:
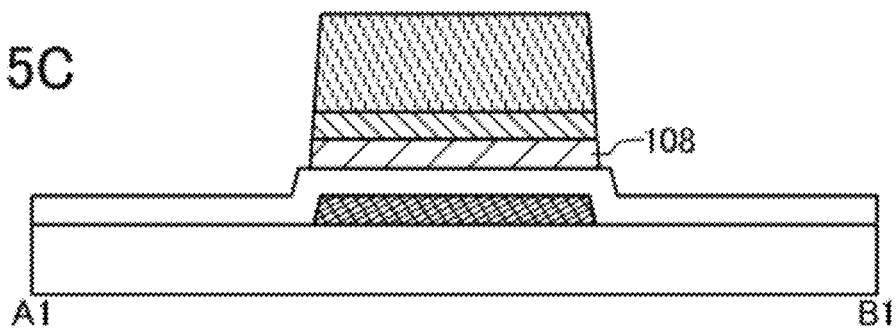

Then, the oxide semiconductor layer 106 is etched using the resist mask 171, so that an island-shaped oxide semiconductor layer 108 is formed (see FIG. 5C). Here, wet etching with the use of an acid-based etchant is performed. When an acid etchant is used, etching selectivity of the oxide semiconductor layer 106 with respect to the silicon layer 111 is high and the oxide semiconductor layer 106 can be selectively etched. As the acid etchant, a mixed liquid of phosphoric acid, acetic acid, nitric acid, and water (also referred to as an aluminum mixed acid) can be used, for example.

Figure 5D:
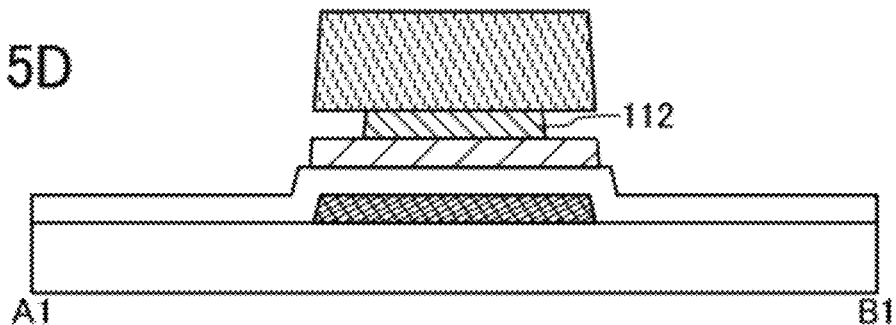

Next, the silicon layer 111 is etched using the resist mask 171, so that an island-shaped silicon layer 112 is formed (see FIG. 5D). Here, wet etching with the use of an alkaline etchant is performed again. When an alkaline etchant is used, etching selectivity of the silicon layer 111 with respect to the oxide semiconductor layer 108 is high and the silicon layer 111 can be selectively etched. Here, etching proceeds isotropically and side surfaces of the silicon layer 111 are etched (side-etched). As the alkaline etchant, tetramethylammonium hydroxide (TMAH) can be used, for example.

By etching the silicon layer in succession to etching of the oxide semiconductor layer in the above-described manner, the oxide semiconductor layer and the silicon layer can be etched without addition of a mask, which simplifies the process.

Figure 5E:
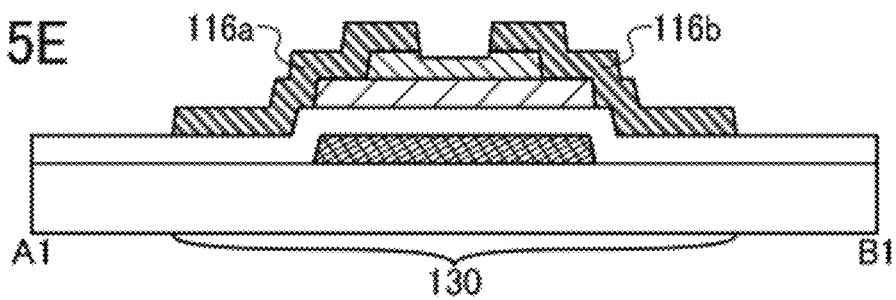

Next, after forming a conductive film over the gate insulating layer 104, the oxide semiconductor layer 108, and the silicon layer 112, the conductive film is etched to form the source electrode layer 116a and the drain electrode layer 116b (see FIG. 5E).

Figure 6A:
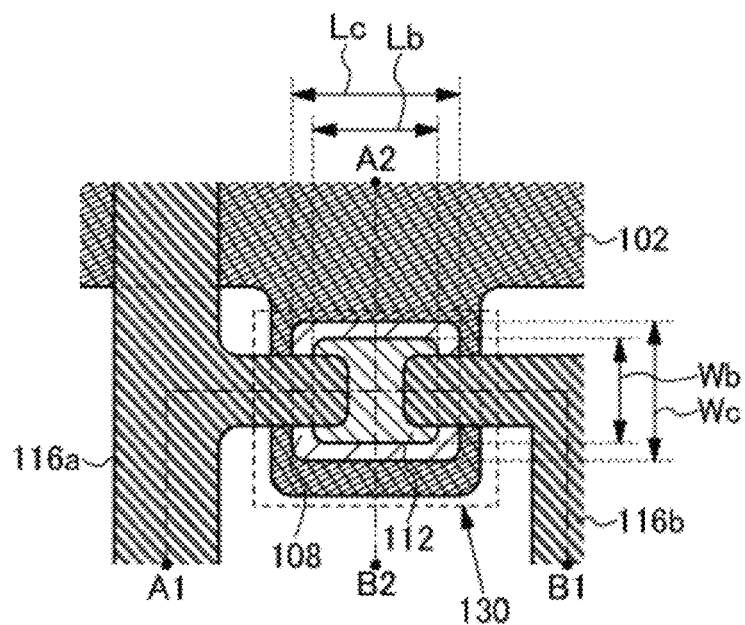
FIGS. 6A to 6C illustrate a structure of a transistor according to Embodiment 2.
Figure 6B:
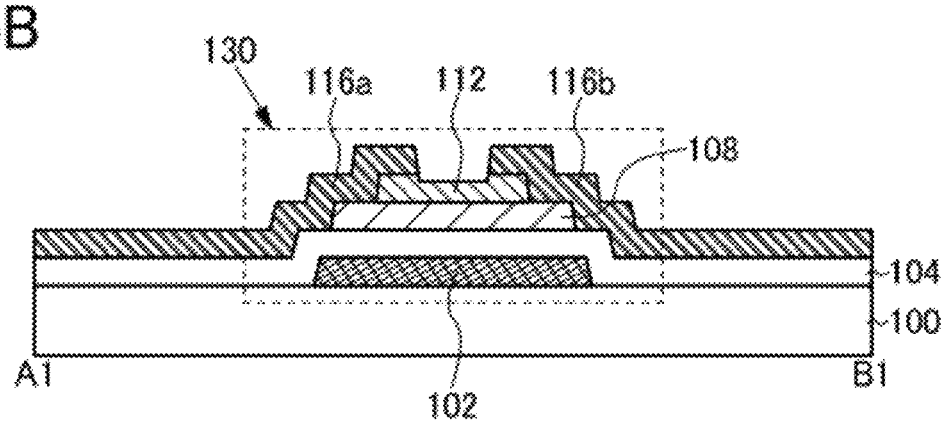
Figure 6C:
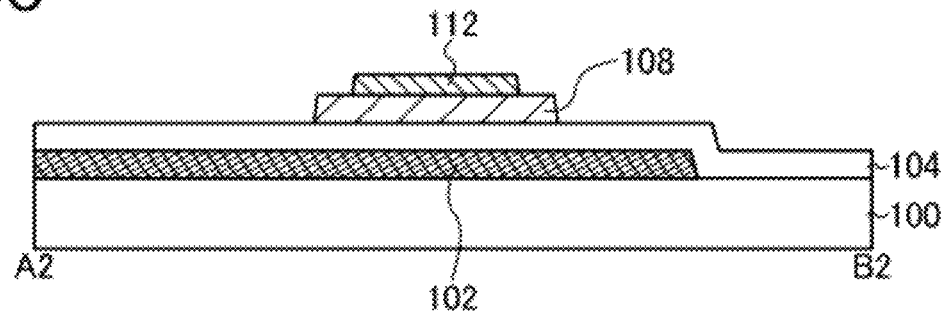

Through the above-described process, a transistor 130 as illustrated in FIGS. 6A to 6C can be manufactured. FIG. 6A is a top view, FIG. 6B is a cross-sectional view taken along line A1-B1 of FIG. 6A, and FIG. 6C is a cross-sectional view taken along line A2-B2 of FIG. 6A.

In the case of using the manufacturing method illustrated in FIGS. 5A to 5E, the width of the silicon layer 112 (Wb) is smaller than the width of the oxide semiconductor layer 108 (Wc) and the length of the silicon layer 112 (Lb) is smaller than the length of the oxide semiconductor layer 108 (Lc), as illustrated in FIGS. 6A to 6C.

By forming the oxide semiconductor layer 106 and the silicon layer 110 in succession in the manufacturing process of FIGS. 5A to 5E, damage to the surface of the oxide semiconductor layer 106 due to an etchant, plasma, or the like can be reduced. By providing, over the oxide semiconductor layer, the silicon layer whose etching selectivity with respect to the oxide semiconductor layer is favorable, the process can be simplified without addition of a mask even in the case of etching the oxide semiconductor layer and the silicon layer.

After the transistor 130 is formed, a protective insulating layer may be formed so as to cover the transistor 130. In the process of FIGS. 5A to 5E, after forming the oxide semiconductor layer 108, heat treatment may be performed in a nitrogen atmosphere or an air atmosphere.

The manufacturing method of the transistor 130 illustrated in FIGS. 6A to 6C is not limited to the method illustrated in FIGS. 5A to 5E. For example, the silicon layer 112 may be formed in the following manner: after the process up to FIG. 5C is performed, ashing with the use of oxygen plasma is performed on the resist mask 171 to isotropically shrink the resist mask 171 and expose part of the silicon layer 111, and then the exposed part of the silicon layer 111 is etched.

This embodiment can be implemented in combination with any of the other structures described in other embodiments, as appropriate.

Embodiment 3

In this embodiment, a transistor which is different from the transistors in Embodiments 1 and 2 and a manufacturing method thereof will be described with reference to the drawings. Note that the manufacturing process (such as applicable materials) described in this embodiment is in common with that of Embodiment 1 in many points. Thus, description of the common points is omitted below and only points different from those of Embodiment 1 will be described in detail.

Figure 7A:
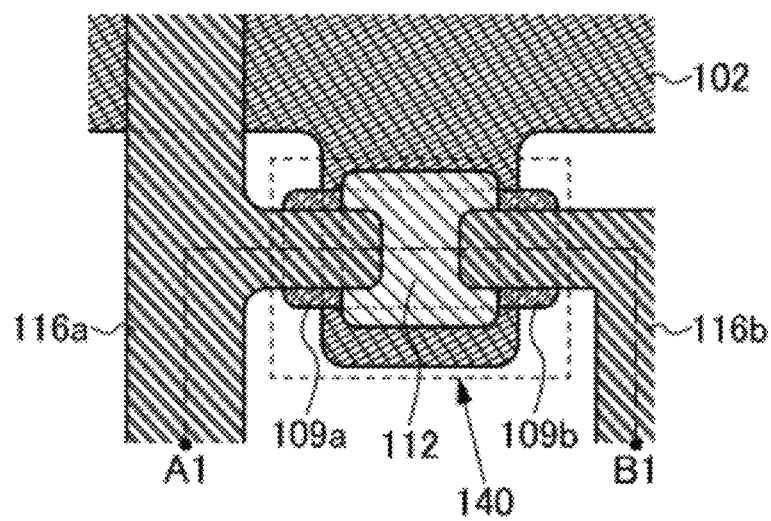
FIGS. 7A and 7B illustrate a structure of a transistor according to Embodiment 3.
Figure 7B:
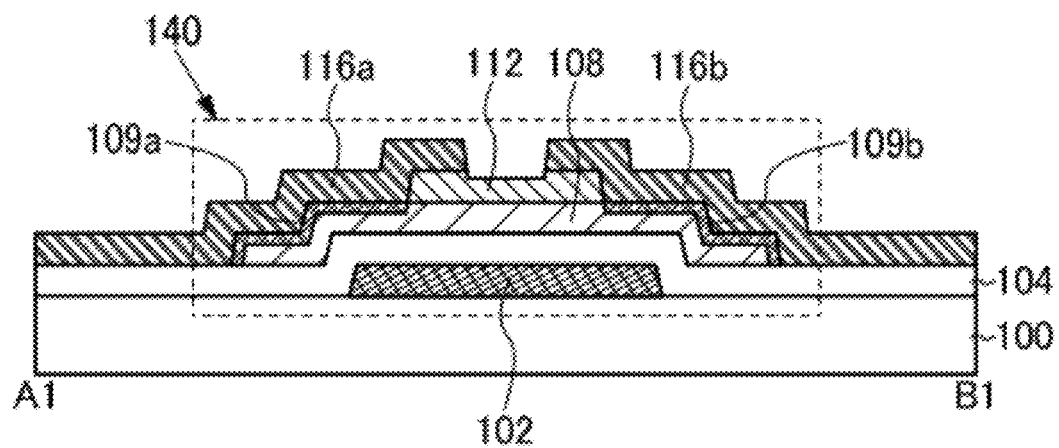

A transistor 140 illustrated in FIGS. 7A and 7B includes a gate electrode 102 provided over a substrate 100, a gate insulating layer 104 provided over the gate electrode 102, an oxide semiconductor layer 108 provided over the gate insulating layer 104, a silicon layer 112 provided over and in contact with a surface of the oxide semiconductor layer 108, and a source electrode layer 116a and a drain electrode layer 116b provided over and in contact with the surface of the oxide semiconductor layer 108. In addition, low-resistance regions 109a and 109b are provided in regions of the oxide semiconductor layer 108, which are in contact with the source electrode layer 116a and the drain electrode layer 116b.

That is, the transistor 140 described in this embodiment has a structure where the low-resistance regions 109a and 109b are added to regions of the oxide semiconductor layer 108 on which the silicon layer 112 is not provided in the above-described embodiments. Note that FIG. 7A is a top view and FIG. 7B is a cross-sectional view taken along line A1-B1 of FIG. 7A.

The low-resistance regions 109a and 109b can be provided by generating oxygen vacancy (by forming regions which are in an oxygen vacancy state as compared to a region which is in contact with the silicon layer 112) in the oxide semiconductor layer 108. Oxygen vacancy may be provided by selectively performing plasma treatment on the regions of the oxide semiconductor layer 108 on which the silicon layer 112 is not provided, using a reducing gas such as hydrogen or argon.

Accordingly, hydrogen may be selectively added to the oxide semiconductor layer 108 to provide the low-resistance regions 109a and 109b.

The low-resistance regions 109a and 109b function as a source region and a drain region in the transistor 140. The source electrode layer 116a is provided in contact with the low-resistance region 109a and the drain electrode layer 116b is provided in contact with the low-resistance region 109b, whereby contact resistance between the oxide semiconductor layer 108 and the source and drain electrode layers 116a and 116b can be reduced.

Next, an example of a method for manufacturing the transistor illustrated in FIGS. 7A and 7B is described with reference to FIGS. 8A to 8D.

Figure 8A:
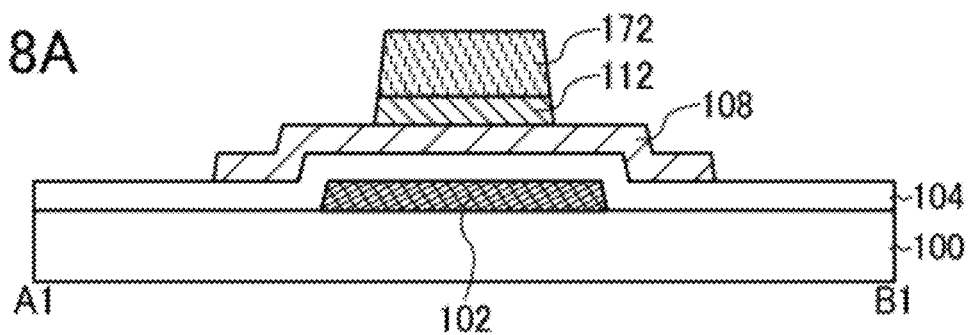
FIGS. 8A to 8D illustrate an example of a manufacturing method of a transistor according to Embodiment 3.

First, the process illustrated in FIGS. 2A to 2D is performed and a resist mask 172 which is used in etching to form the silicon layer 112 is left (see FIG. 8A).

Figure 8B:
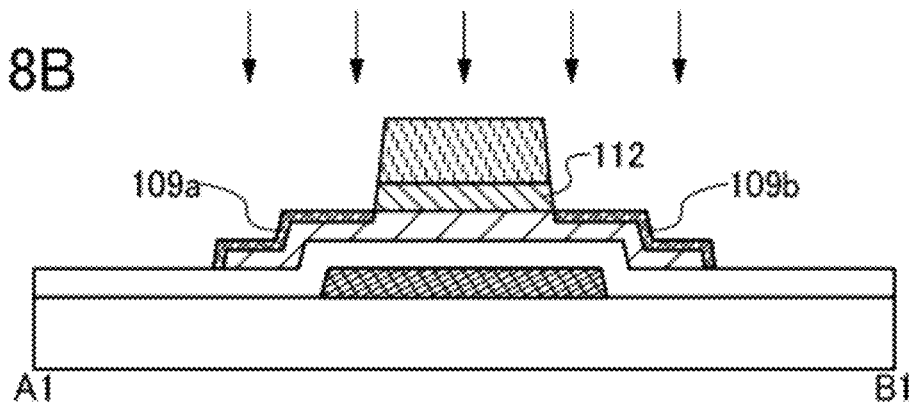

Next, the oxide semiconductor layer 108 is subjected to plasma treatment using a reducing gas such as hydrogen or argon with the use of the resist mask 172, so that the low-resistance regions 109a and 109b are formed in the oxide semiconductor layer 108 (see FIG. 8B).

Figure 8C:
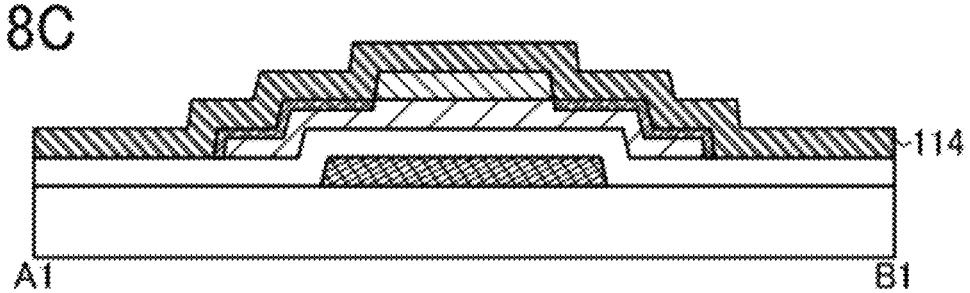

Then, a conductive film 114 is formed over the gate insulating layer 104, the oxide semiconductor layer 108, and the silicon layer 112 (see FIG. 8C). Note that the conductive film 114 is formed so as to be in contact with the low-resistance regions 109a and 109b in the oxide semiconductor layer 108.

Figure 8D:
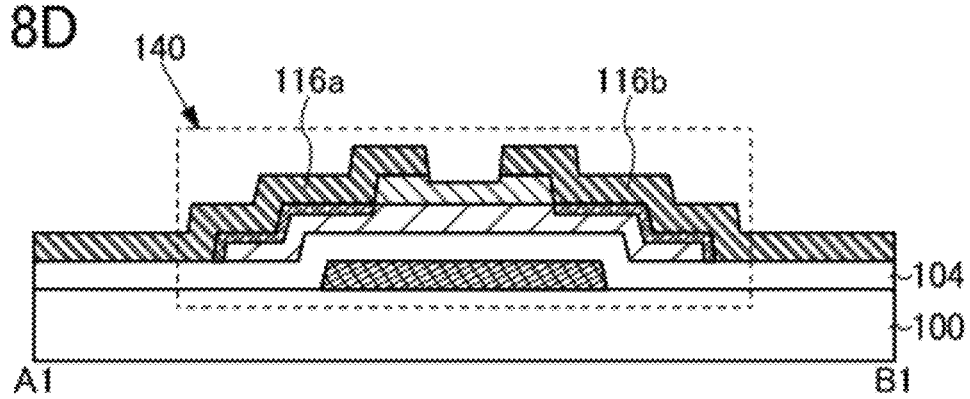

Next, the conductive film 114 is etched to form the source electrode layer 116a and the drain electrode layer 116b (see FIG. 8D).

Through the above process, the transistor 140 can be manufactured.

Note that a protective insulating layer may be formed so as to cover the transistor 140 after the transistor 140 is formed. In addition, in the process of FIGS. 8A to 8D, after the oxide semiconductor layer 108 is formed, heat treatment may be performed under a nitrogen atmosphere or an air atmosphere.

Note that in FIGS. 7A and 7B and FIGS. 8A to 8D, the case where the contact resistance between the oxide semiconductor layer 108 and the source and drain electrode layers 116a and 116b is reduced by providing the low-resistance regions 109a and 109b in the oxide semiconductor layer 108 is described; however, the present invention is not limited thereto.

Figure 9A:
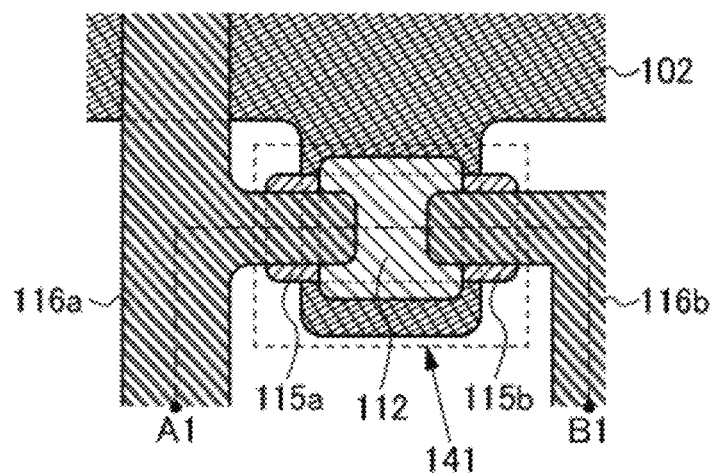
FIGS. 9A to 9C illustrate structures of a transistor according to Embodiment 3.
Figure 9B:
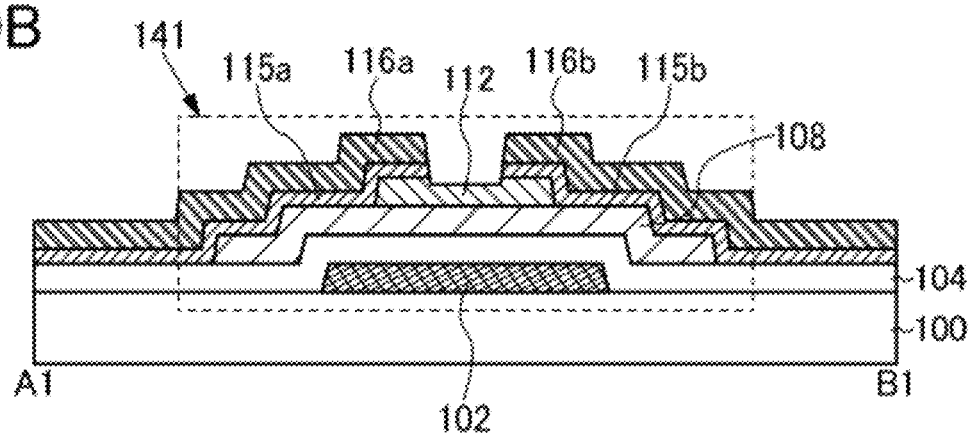

As in a transistor 141 illustrated in FIGS. 9A and 9B, a first metal oxide layer 115a and a second metal oxide layer 115b may be provided between the oxide semiconductor layer 108 and the source electrode layer 116a and between the oxide semiconductor layer 108 and the drain electrode layer 116b, respectively. Note that FIG. 9A is a top view and FIG. 9B is a cross-sectional view taken along line A1-B1 of FIG. 9A.

The first metal oxide layer 115a and the second metal oxide layer 115b may be provided using metal oxide whose resistance is at least lower than that of the oxide semiconductor layer 108.

The first metal oxide layer 115a and the second metal oxide layer 115b can be provided using the same material as that of the oxide semiconductor layer 108 and under different deposition conditions. For example, in the case where an In—Ga—Zn—O based non-single-crystal film is used as the oxide semiconductor layer 108, the first metal oxide layer 115a, and the second metal oxide layer 115b, the In—Ga—Zn—O based non-single-crystal film of the oxide semiconductor layer 108 is formed under deposition conditions where the ratio of an oxygen gas flow rate to an argon gas flow rate is higher than the ratio of an oxygen gas flow rate to an argon gas flow rate under the deposition conditions for the In—Ga—Zn—O based non-single-crystal films of the first metal oxide layer 115a and the second metal oxide layer 115b. Specifically, the In—Ga—Zn—O based non-single-crystal film of the first metal oxide layer 115a and the second metal oxide layer 115b can be formed in a rare gas (such as argon or helium) atmosphere (or an atmosphere including an oxygen gas at 10% or less and an argon gas at 90% or more), and the In—Ga—Zn—O based non-single-crystal film of the oxide semiconductor layer 108 can be formed in an oxygen mixed atmosphere (an atmosphere where an oxygen gas flow rate is more than a rare gas flow rate).

The first metal oxide layer 115a and the second metal oxide layer 115b are provided between the oxide semiconductor layer 108 and the source electrode layer 116a and between the oxide semiconductor layer 108 and the drain electrode layer 116b, respectively, in this manner, whereby a carrier injection barrier from the source electrode layer 116a and the drain electrode layer 116b can be reduced. Thus, the contact resistance between the oxide semiconductor layer 108 and the source and drain electrode layers 116a and 116b can be reduced.

Note that after the process in FIGS. 2A to 2D is performed, a metal oxide layer and the conductive film 114 are formed in this order over the silicon layer 112 and the oxide semiconductor layer 108, and the metal oxide layer is etched in the same manner as the etching of the conductive film 114, so that the first metal oxide layer 115a and the second metal oxide layer 115b can be formed. In this case, the conductive film 114 and the metal oxide layer or the conductive film 114, the metal oxide layer, and the oxide semiconductor layer 108 are etched at the same time in some cases, depending on the etching condition and selected materials.

Figure 9C:
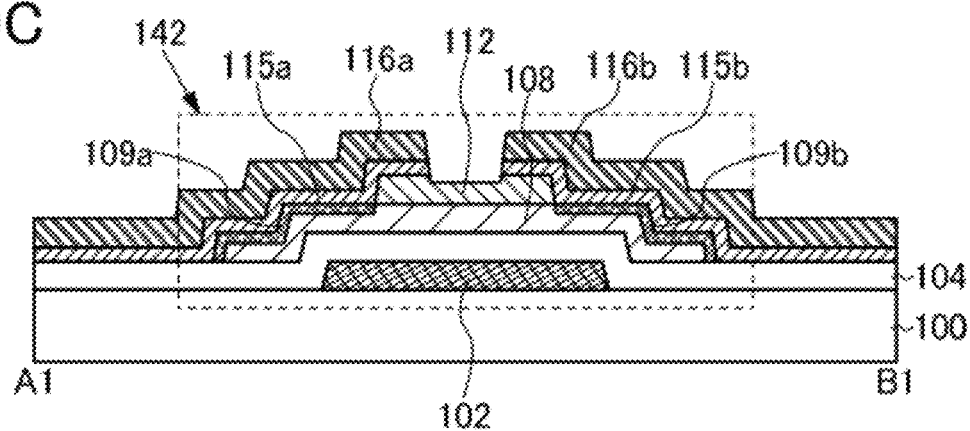

As in a transistor 142 illustrated in FIG. 9C, the low-resistance regions 109a and 109b may be provided in the oxide semiconductor layer 108 and, at the same time, the first metal oxide layer 115a and the second metal oxide layer 115b may also be provided.

This embodiment can be implemented in combination with any of the structures of the other embodiments as appropriate.

Embodiment 4

In this embodiment, a transistor which is different from the transistors in Embodiments 1 to 3 and a manufacturing method thereof will be described with reference to the drawings. Note that the manufacturing process (such as applicable materials) described in this embodiment is in common with that of Embodiment 1 in many points. Thus, description of the common points is omitted below and only points different from those of Embodiment 1 will be described in detail.

Figure 10A:
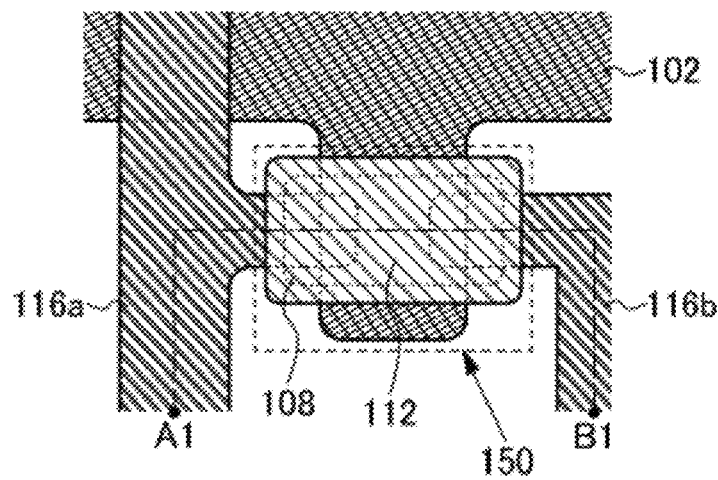
FIGS. 10A to 10C illustrate structures of a transistor according to Embodiment 4.
Figure 10B:
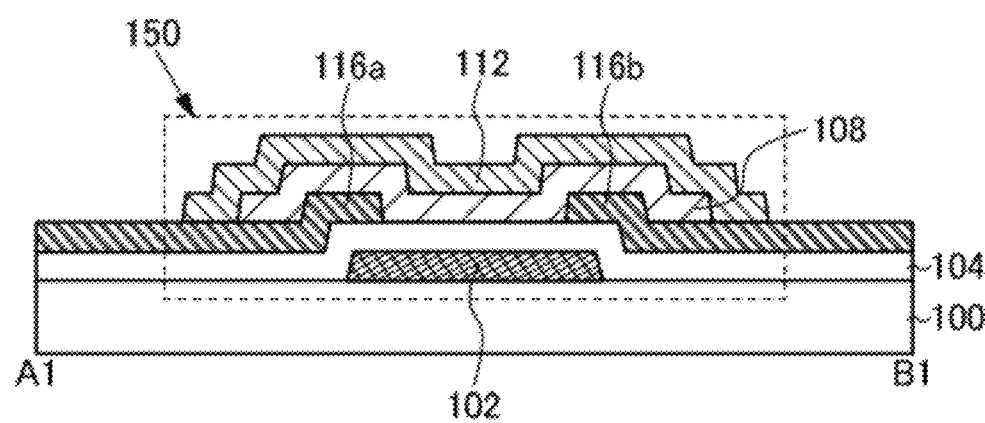

A transistor 150 illustrated in FIGS. 10A and 10B includes a gate electrode 102 provided over a substrate 100, a gate insulating layer 104 provided over the gate electrode 102, a source electrode layer 116a and a drain electrode layer 116b provided over the gate insulating layer 104, an oxide semiconductor layer 108 provided over the source electrode layer 116a and the drain electrode layer 116b and provided over the gate insulating layer 104 which is located in a region above the gate electrode 102 and between the source electrode layer 116a and the drain electrode layer 116b, and a silicon layer 112 provided so as to cover the oxide semiconductor layer 108.

Figure 10C:
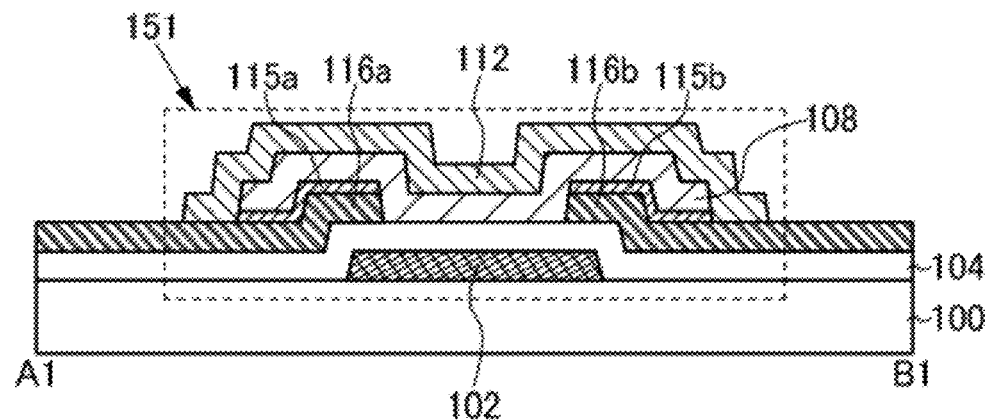

That is, the transistor 150 and a transistor 151 described in this embodiment have a structure where the position of the source electrode layer 116a and the drain electrode layer 116b and the position of the oxide semiconductor layer 108 (the order of stacking) are interchanged in the structures of the above embodiments. The structures illustrated in FIGS. 10A to 10C are also called a bottom-gate bottom-contact type. Note that FIG. 10A is a top view and FIG. 10B is a cross-sectional view taken along line A1-B1 of FIG. 10A.

By providing the silicon layer 112 in contact with the back channel side (the surface on the opposite side from the gate electrode 102) of the oxide semiconductor layer 108 as illustrated in FIGS. 10A and 10B, entry of hydrogen into the oxide semiconductor layer 108 can be suppressed. As a result, variation in semiconductor characteristics of the oxide semiconductor layer 108 due to the entry of hydrogen can be suppressed, which can suppress variation in characteristics of the transistor in which the oxide semiconductor layer 108 is used as a channel layer.

As in the transistor 151 illustrated in FIG. 10C, metal oxide layers 115a and 115b may be provided between the oxide semiconductor layer 108 and the source electrode layer 116a and between the oxide semiconductor layer 108 and the drain electrode layer 116b. The contact resistance between the oxide semiconductor layer 108 and the source and drain electrode layers 116a and 116b can be reduced by providing the metal oxide layers 115a and 115b.

Next, an example of a method for manufacturing the transistor illustrated in FIGS. 10A and 10B is described with reference to FIGS. 11A to 11E.

First, the gate electrode 102 is formed over the substrate 100 and the gate insulating layer 104 is formed over the gate electrode 102. After that, the source electrode layer 116a and the drain electrode layer 116b are formed over the gate insulating layer 104 (see FIG. 11A).

Figure 11A:
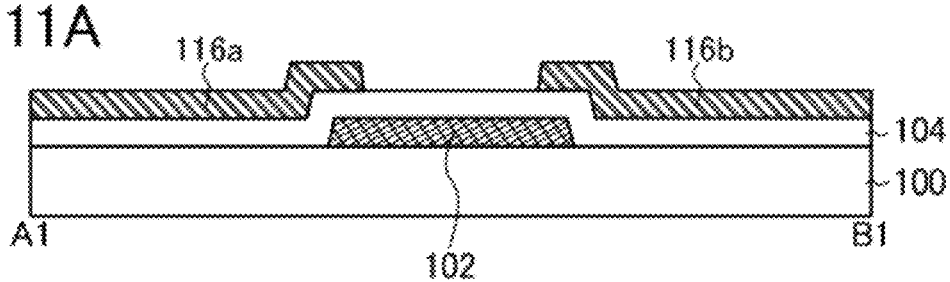
FIGS. 11A to 11E illustrate an example of a manufacturing method of a transistor according to Embodiment 4.
Figure 11B:
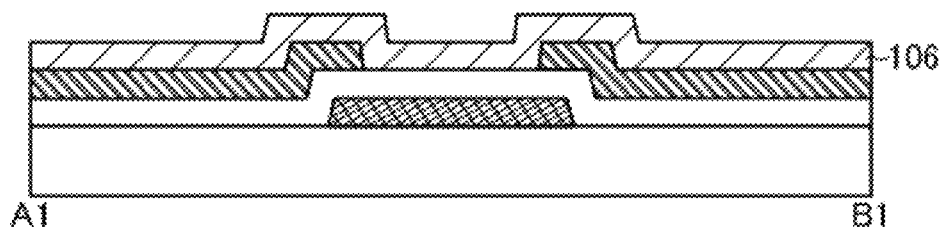

Next, an oxide semiconductor layer 106 is formed so as to cover the source electrode layer 116a and the drain electrode layer 116b (see FIG. 11B).

Figure 11C:
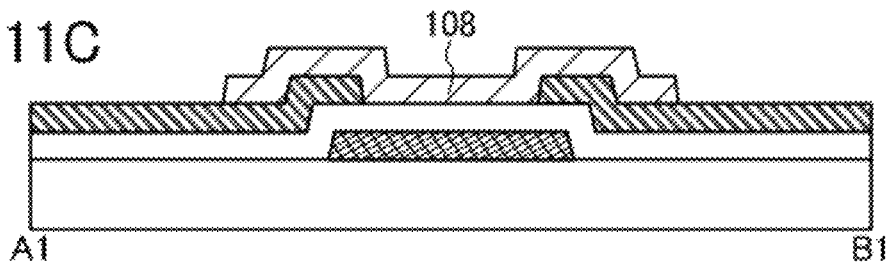

Then, the oxide semiconductor layer 106 is etched to form the island-shaped oxide semiconductor layer 108 (see FIG. 11C). At this time, the oxide semiconductor layer 106 is etched so as to leave the island-shaped oxide semiconductor layer 108 at least above the gate electrode 102.

Figure 11D:
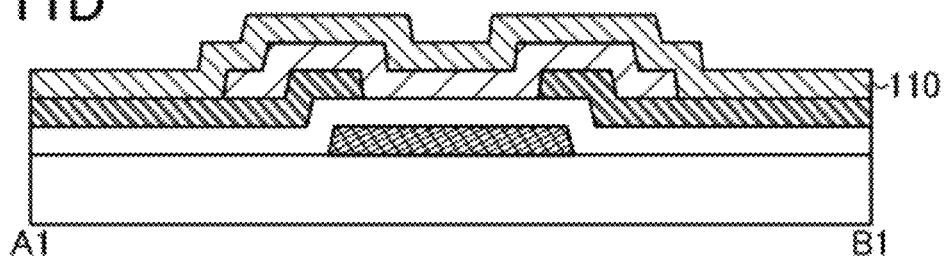

Next, a silicon layer 110 is formed so as to cover the oxide semiconductor layer 108 (see FIG. 11D).

Figure 11E:
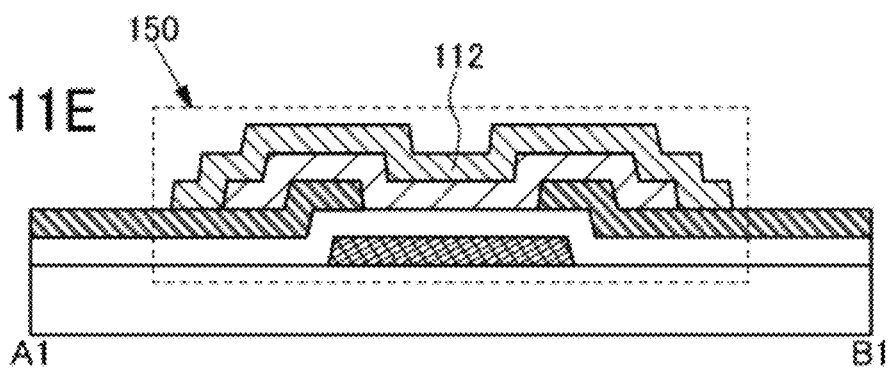

Next, the silicon layer 110 is etched to form the island-shaped silicon layer 112 (see FIG. 11E).

Through the above process, the transistor 150 can be manufactured.

Note that after the transistor 150 is formed, a protective insulating layer may be formed so as to cover the transistor 150. In addition, in the process of FIGS. 11A to 11E, heat treatment may be performed under a nitrogen atmosphere or an air atmosphere after the oxide semiconductor layer 108 is formed.

In the case where the transistor illustrated in FIG. 10C is manufactured, in FIG. 11A, a conductive film forming the source electrode layer 116a and the drain electrode layer 116b and a metal oxide layer forming the metal oxide layers 115a and 115b may be stacked in this order over the gate insulating layer 104, and then may be etched. In addition, the structure illustrated in FIG. 10C shows the case where the metal oxide layers 115a and 115b are etched at the same time when the oxide semiconductor layer 106 is etched to form the island-shaped oxide semiconductor layer 108.

Figure 12A:
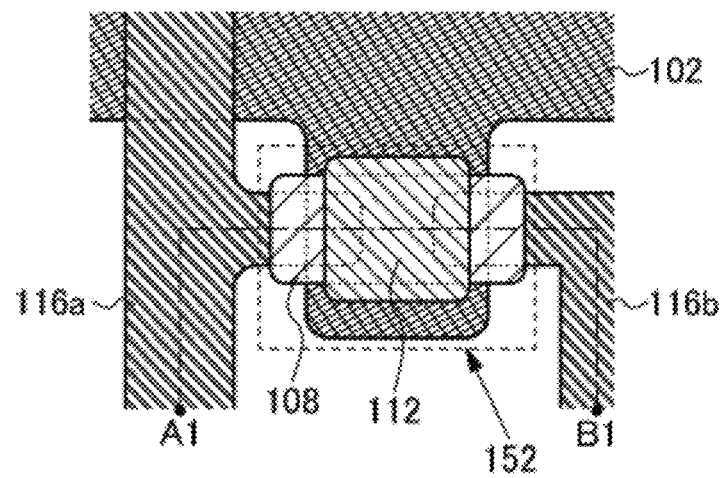
FIGS. 12A and 12B illustrate a structure of a transistor according to Embodiment 4.
Figure 12B:
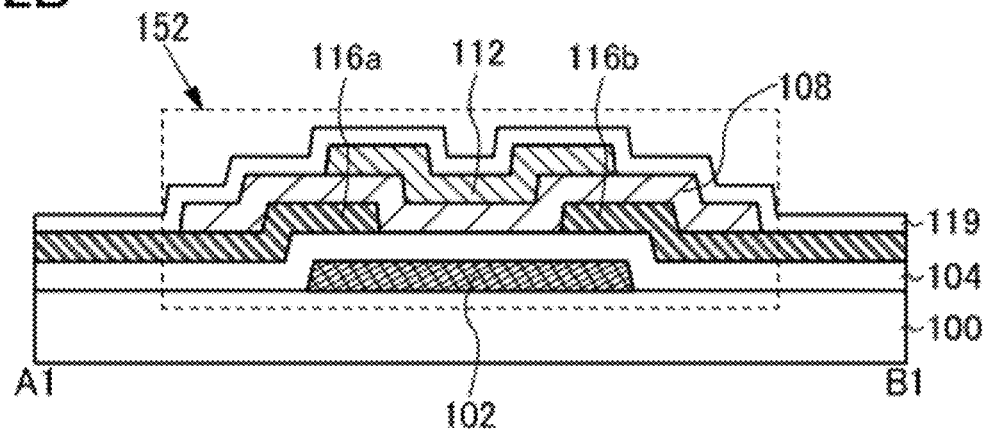

Note that in FIGS. 11A to 11E, the case where the island-shaped silicon layer 112 is formed so as to completely cover the oxide semiconductor layer 108 is described; however, the present invention is not limited thereto. The silicon layer 112 may be provided at least so as to be in contact with a region where a channel is formed in the oxide semiconductor layer 108. For example, as in a transistor 152 illustrated in FIGS. 12A and 12B, the silicon layer 112 can be provided so as to be in contact with part of the oxide semiconductor layer 108. In FIGS. 12A and 12B, the case is shown where the silicon layer 112 is formed so as to be in contact with the part of the oxide semiconductor layer 108 (formed so as not to be in contact with the source electrode layer 116a and the drain electrode layer 116b), and a protective insulating layer 119 is provided over the silicon layer 112, the oxide semiconductor layer 108, and the source electrode layer 116a and the drain electrode layer 116b.

As the protective insulating layer 119, for example, a single layer or a stacked layer of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a CVD method, a sputtering method, or the like.

Note that FIG. 12A is a top view and FIG. 12B is a cross-sectional view taken along line A1-B1 of FIG. 12A.

This embodiment can be implemented in combination with any of the structures of the other embodiments as appropriate.

Embodiment 5

In this embodiment, a manufacturing process of a display device which is an example of a usage pattern of a semiconductor device including the transistor described in any of Embodiments 1 to 4 will be described with reference to the drawings. Note that the manufacturing process (such as applicable materials) described in this embodiment is in common with that of Embodiment 1 in many points. Thus, description of the common points is omitted below and only points different from those of Embodiment 1 will be described in detail. Note that in the following description, each of FIG. 15, FIG. 16, FIG. 17, FIG. 18, and FIG. 19 is a top view, and each of FIGS. 13A to 13D and FIGS. 14A to 14C is a cross-sectional view taken along line A3-B3 and line A4-B4 of FIG. 15, FIG. 16, FIG. 17, FIG. 18, and FIG. 19.

Figure 15:
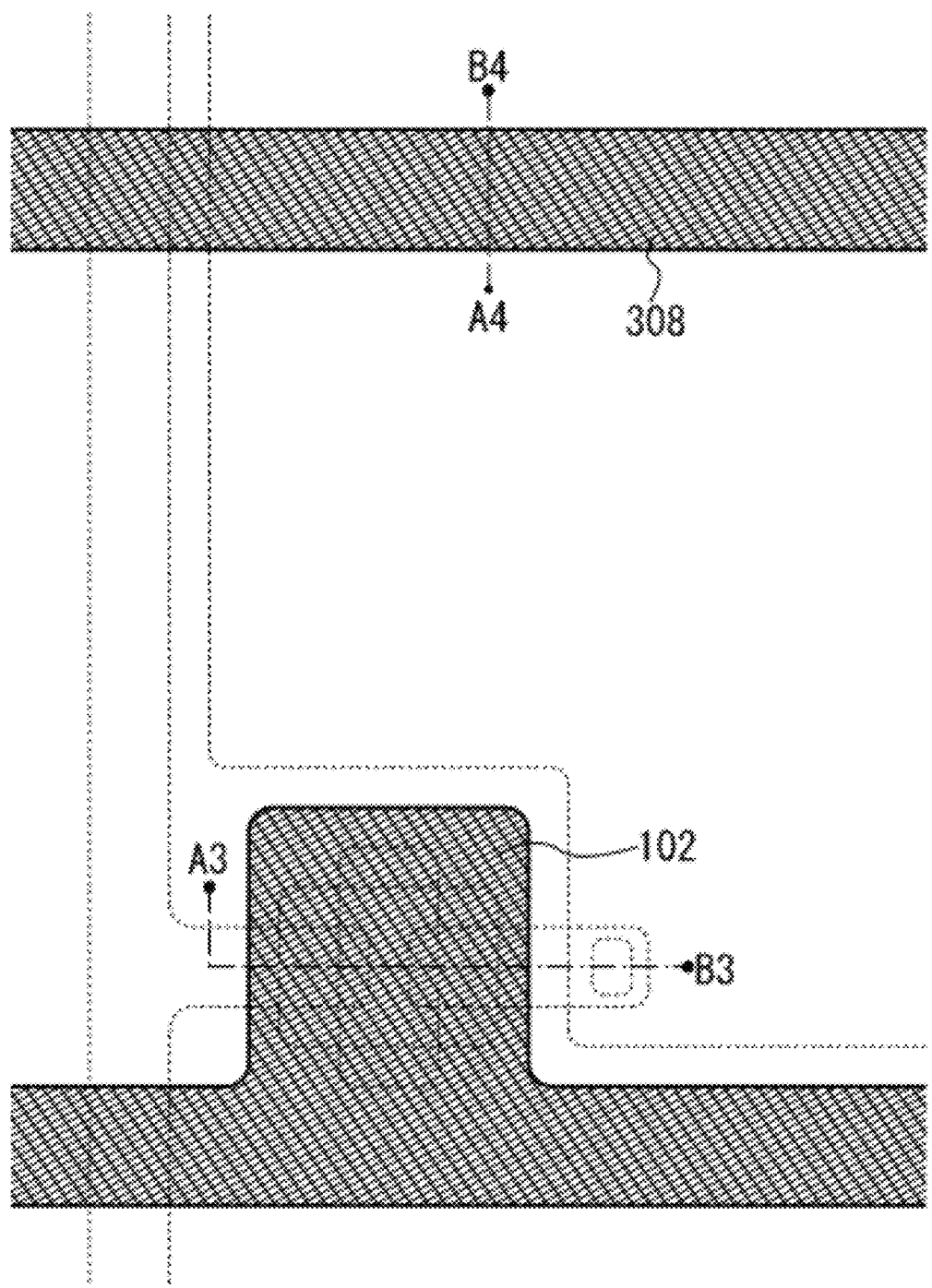
FIG. 15 illustrates an example of a manufacturing method of a semiconductor device according to Embodiment 5.
Figure 16:
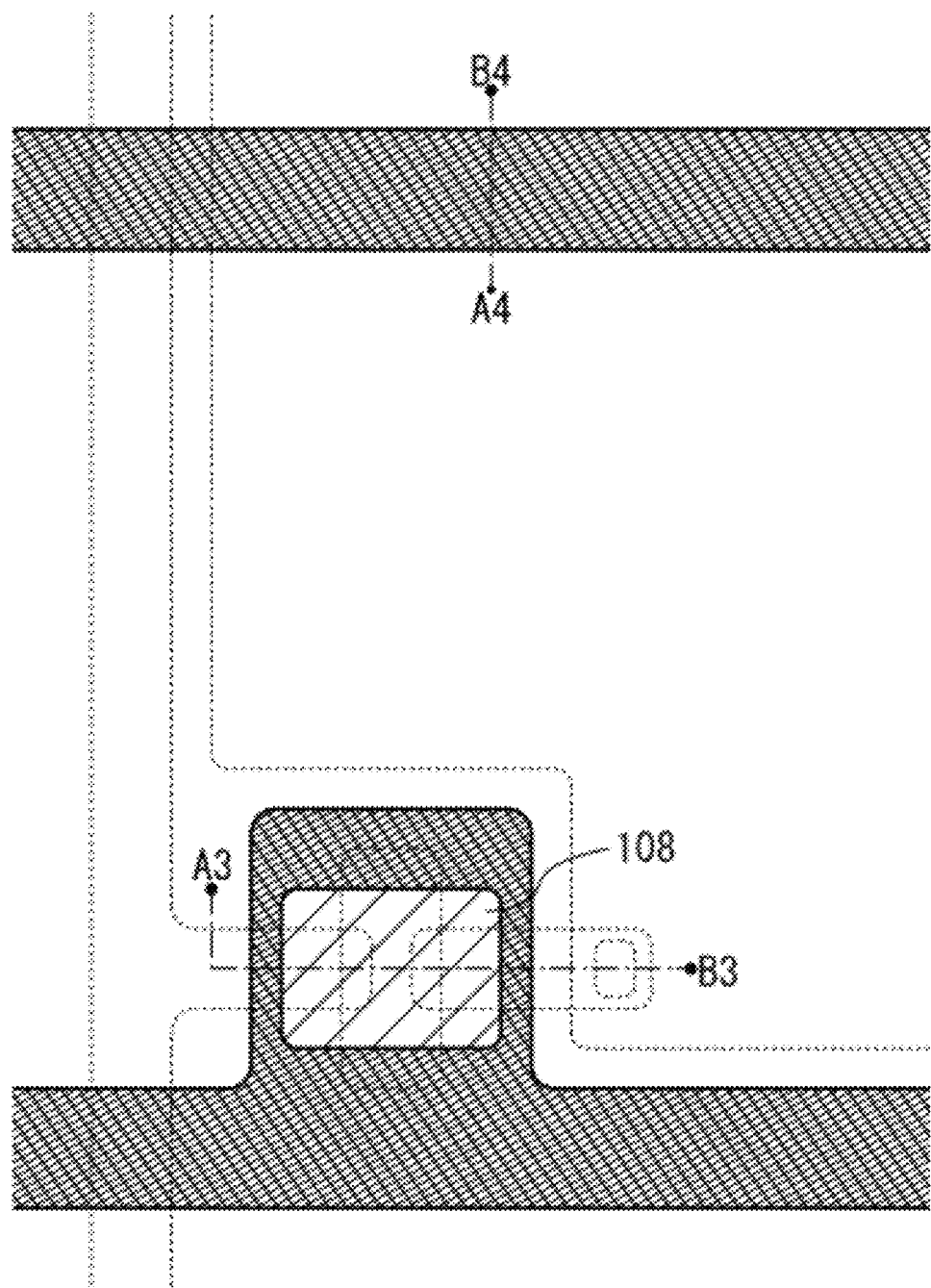
FIG. 16 illustrates an example of a manufacturing method of a semiconductor device according to Embodiment 5.

First, a wiring and an electrode (a gate wiring including the gate electrode 102, a capacitor wiring 308, and a first terminal 321) are formed over the substrate 100 having an insulating surface, and then the gate insulating layer 104 and the oxide semiconductor layer 106 are formed in succession (see FIG. 13A and FIG. 15).

The capacitor wiring 308 and the first terminal 321 can be formed using the same material as that of the gate electrode layer 102, simultaneously.

After the oxide semiconductor layer 106 is etched to form the island-shaped oxide semiconductor layer 108 (see FIG. 16), the silicon layer 110 is formed so as to cover the oxide semiconductor layer 108 (see FIG. 13B). At this time, the oxide semiconductor layer 106 is etched so as to leave the island-shaped oxide semiconductor layer 108 at least above the gate electrode 102.

Figure 17:
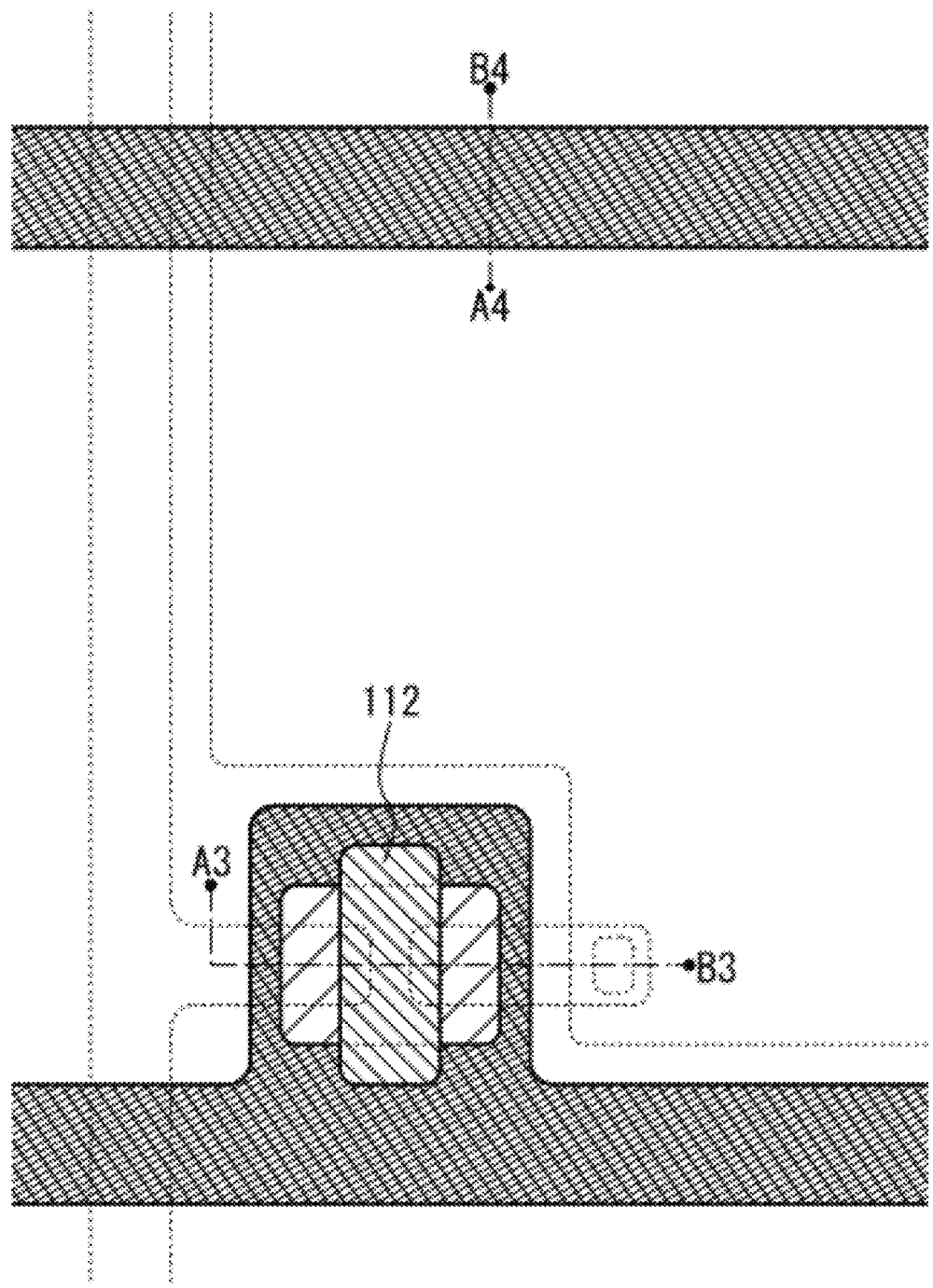
FIG. 17 illustrates an example of a manufacturing method of a semiconductor device according to Embodiment 5.

Then, the silicon layer 110 is etched to form the island-shaped silicon layer 112 (see FIG. 13C and FIG. 17). At this time, the silicon layer 110 is etched so as to leave the island-shaped silicon layer 112 at least in a region overlapping with the gate electrode 102. In addition, the silicon layer 110 is etched so as to expose at least part of the oxide semiconductor layer 108.

After a contact hole 313 is formed in the gate insulating layer 104 so as to expose the first terminal 321, the conductive film 114 is formed so as to cover the gate insulating layer 104, the oxide semiconductor layer 108, and the silicon layer 112 (see FIG. 13D). Thus, the conductive film 114 and the first terminal 321 are electrically connected to each other through the contact hole 313.

Figure 18:
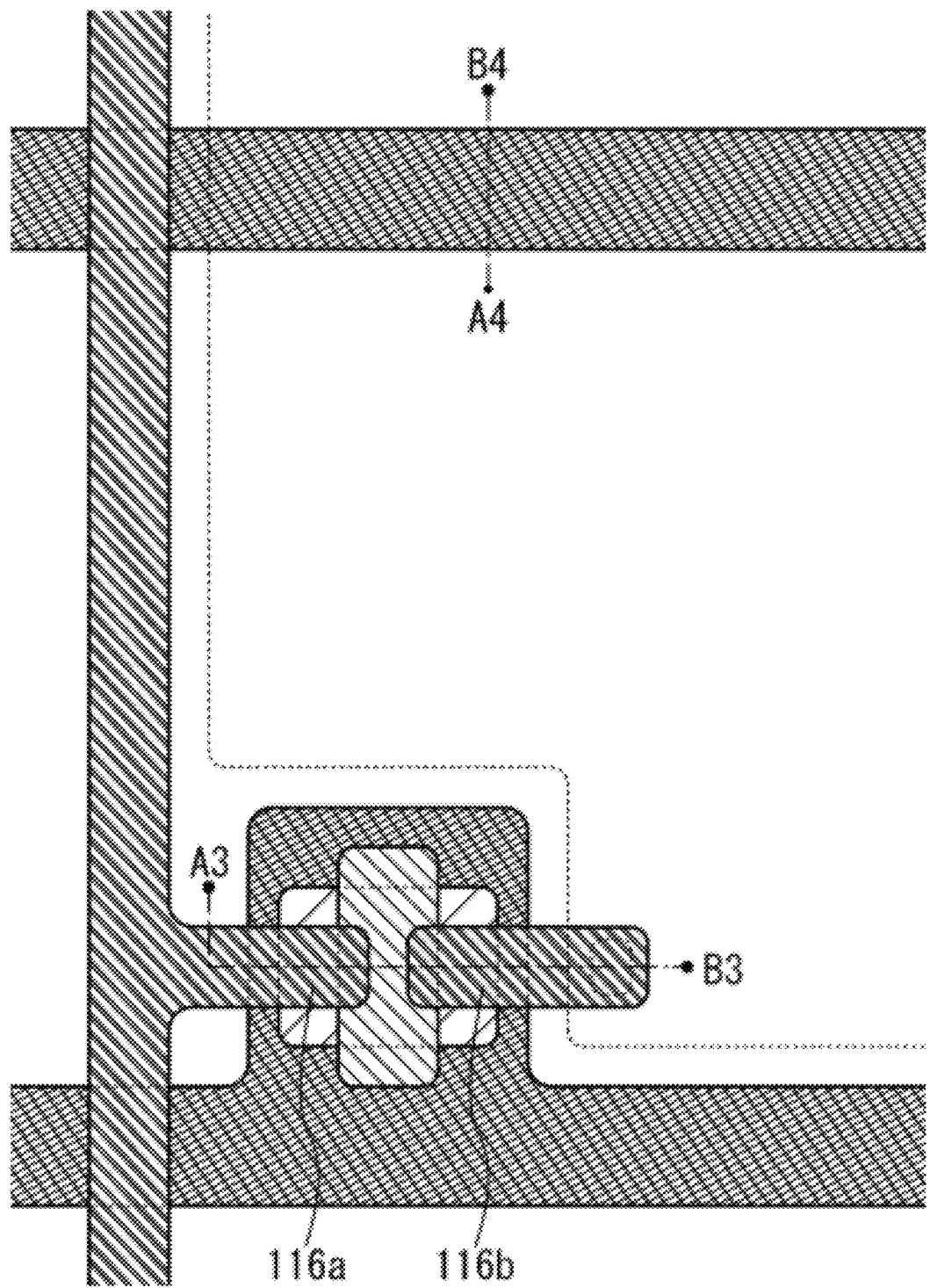
FIG. 18 illustrates an example of a manufacturing method of a semiconductor device according to Embodiment 5.

Next, the conductive film 114 is etched to form the source electrode layer 116a, the drain electrode layer 116b, a connection electrode 320, and a second terminal 322 (see FIG. 14A and FIG. 18). In this case, the silicon layer 112 functions as a channel protective layer of the oxide semiconductor layer 108.

The second terminal 322 can be electrically connected to a source wiring (a source wiring including the source electrode layer 116a). The connection electrode 320 can be directly connected to the first terminal 321.

Through the above process, the thin film transistor 160 can be manufactured.

Next, heat treatment is preferably performed at 200° C. to 600° C., typically, 300° C. to 500° C. For example, heat treatment is performed under a nitrogen atmosphere at 350° C. for one hour. By this heat treatment, rearrangement of the In—Ga—Zn—O based non-single-crystal film forming the oxide semiconductor layer 108 is performed at the atomic level. This heat treatment (which may be light annealing) is effective because distortion which hinders the transfer of carriers is reduced by this heat treatment. Note that there is no particular limitation on the timing to perform the heat treatment as long as it is after the formation of the oxide semiconductor layer 106, and for example, the heat treatment may be performed after a pixel electrode is formed.

Next, a protective insulating layer 340 is formed so as to cover the transistor 160, and the protective insulating layer 340 is selectively etched to form a contact hole 325 which reaches the drain electrode layer 116b, a contact hole 326 which reaches the connection electrode 320, and a contact hole 327 which reaches the second terminal 322 (see FIG. 14B).

Figure 19:
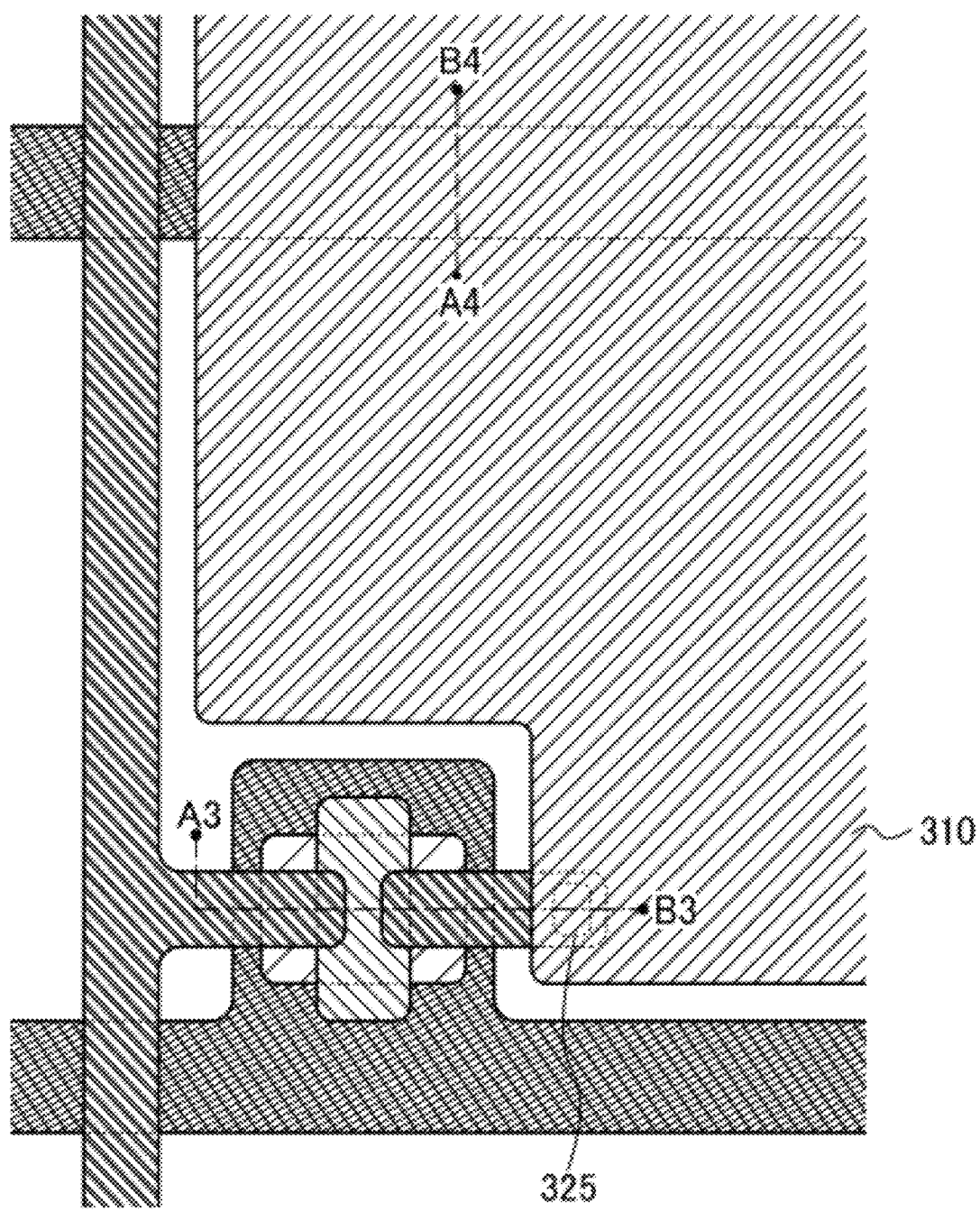
FIG. 19 illustrates an example of a manufacturing method of a semiconductor device according to Embodiment 5.

Next, a transparent conductive layer 310 which is electrically connected to the drain electrode layer 116b, a transparent conductive layer 328 which is electrically connected to the connection electrode 320, and a transparent conductive layer 329 which is electrically connected to the second terminal 322 are formed (see FIG. 14C and FIG. 19).

The transparent conductive layer 310 functions as a pixel electrode, and the transparent conductive layers 328 and 329 serve as electrodes or wirings used for connection with an FPC. More specifically, the transparent conductive layer 328 formed over the connection electrode 320 can be used as a terminal electrode for connection which functions as an input terminal of a gate wiring, and the transparent conductive layer 329 formed over the second terminal 322 can be used as a terminal electrode for connection which functions as an input terminal of a source wiring.

In addition, a storage capacitor can be formed using the capacitor wiring 308, the gate insulating layer 104, the protective insulating layer 340, and the transparent conductive layer 310. In this case, the capacitor wiring 308 and the transparent conductive layer 310 each serve as an electrode, and the gate insulating layer 104 and the protective insulating layer 340 each serve as a dielectric.

The transparent conductive layers 310, 328, and 329 can be formed using indium oxide ($In_2O_3$), an alloy of indium oxide and tin oxide ($In_2O_3$—$SnO_2$, abbreviated as ITO), an alloy of indium oxide and zinc oxide ($In_2O_3$—$ZnO$), or the like by a sputtering method, a vacuum evaporation method, or the like. For example, a transparent conductive film is formed, and then a resist mask is formed over the transparent conductive film. Then, an unnecessary portion is removed by etching, whereby the transparent conductive layers 310, 328, and 329 can be formed.

Through the above process, elements such as a bottom-gate n-channel thin film transistor and the storage capacitor can be completed. By arranging these elements in matrix corresponding to respective pixels, an active matrix display device can be manufactured.

This embodiment can be implemented in combination with any of the structures of the other embodiments as appropriate.

Embodiment 6

Figures 1, 20A:
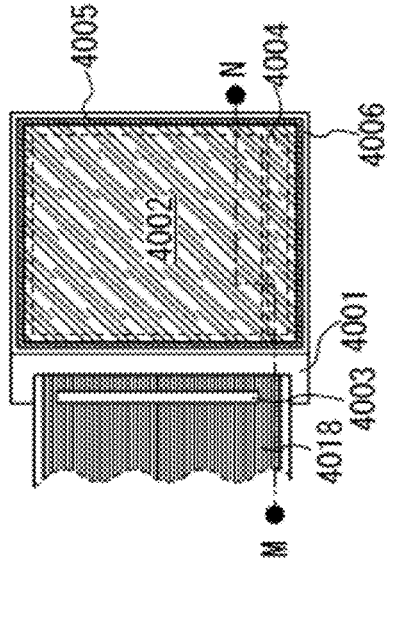
FIGS. 20A-1, 20A-2, and 20B illustrate examples of a semiconductor device according to Embodiment 6.
Figures 2, 20A:
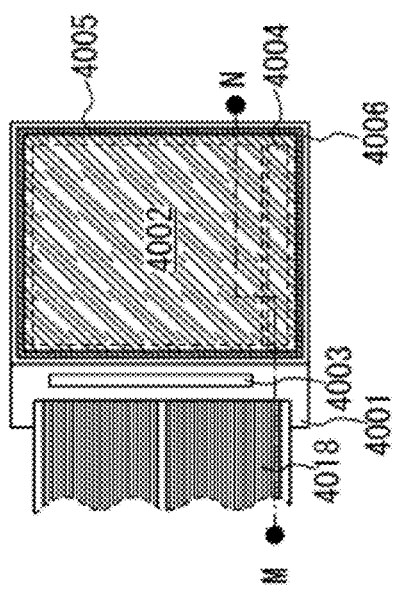
Figure 20B:
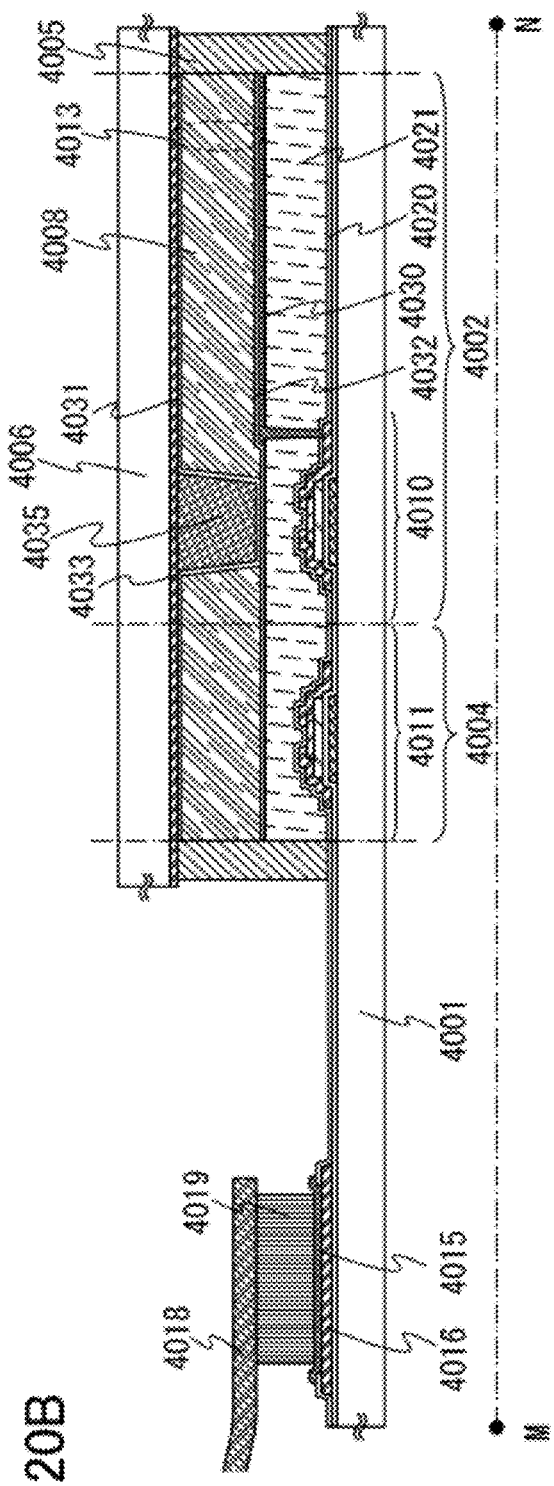

In this embodiment, an example of a liquid crystal display device will be described as a semiconductor device including a thin film transistor. First, the appearance and a cross section of a liquid crystal display panel, which is one mode of the semiconductor device, will be described with reference to FIGS. 20A-1, 20A-2, and 20B. FIGS. 20A-1 and 20A-2 are each a top view of a panel in which thin film transistors 4010 and 4011 which include an oxide semiconductor layer, and a liquid crystal element 4013, which are formed over a first substrate 4001, are sealed between the first substrate 4001 and a second substrate 4006 with a sealant 4005. FIG. 20B corresponds to a cross-sectional view taken along line M-N of FIGS. 20A-1 and 20A-2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 as well as a liquid crystal layer 4008 are sealed between the first substrate 4001 and the second substrate 4006 with the sealant 4005. A signal line driver circuit 4003 that is formed using a single crystal semiconductor film or a polycrystalline semiconductor film over a substrate which is prepared separately is mounted in a region that is different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 20A-1 illustrates an example in which the signal line driver circuit 4003 is mounted by a COG method, and FIG. 20A-2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 20B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

Any of the structures described in the above embodiments can be applied to the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap corresponds to the liquid crystal element 4013. Note that the pixel electrode layer 4030 and the counter electrode layer 4031 are provided with insulating layers 4032 and 4033 which function as alignment films, respectively, and the liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be formed using glass, metal (typically, stainless steel), ceramic, or plastic. As for plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer denoted by reference numeral 4035 is obtained by selective etching of an insulating film and is provided to control a distance (a cell gap) between the pixel electrode layer 4030 and the counter electrode layer 4031. Note that a spherical spacer may also be used. In addition, the counter electrode layer 4031 is electrically connected to a common potential line provided on the same substrate as the thin film transistor 4010. With the use of a common connection portion, the counter electrode layer 4031 and the common potential line can be electrically connected to each other through conductive particles arranged between a pair of substrates. Note that the conductive particles are included in the sealant 4005.

In addition, liquid crystal exhibiting a blue phase for which an alignment film is unnecessary may be used. The blue phase is one of liquid crystal phases and a phase which appears just before the transition from a cholesteric phase to an isotropic phase when the temperature of cholesteric liquid crystal is increased. Because the blue phase appears only in a small temperature range, a liquid crystal composition in which greater than or equal to 5 weight % of a chiral agent is mixed is used for the liquid crystal layer 4008 in order to improve the temperature range. The liquid crystal composition including liquid crystal exhibiting a blue phase and a chiral agent has a short response time of 10 μs to 100 μs and are optically isotropic; therefore, alignment treatment is unnecessary, and viewing angle dependence is small.

Note that the liquid crystal display device described in this embodiment is an example of a transmissive liquid crystal display device; however, the liquid crystal display device can be applied to either a reflective liquid crystal display device or a semi-transmissive liquid crystal display device.

The liquid crystal display device described in this embodiment is an example in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is also not limited to this embodiment and may be appropriately set depending on materials of the polarizing plate and the coloring layer or conditions of the manufacturing process. In addition, a light-blocking film which functions as a black matrix may be provided.

In this embodiment, in order to reduce surface unevenness of the thin film transistors and to improve reliability of the thin film transistors, the thin film transistors are covered with the insulating layers (the insulating layer 4020 and the insulating layer 4021) functioning as a protective film or a planarizing insulating film. Note that the protective film is provided to prevent entry of a contaminant impurity such as an organic substance, a metal substance, or moisture floating in air and is preferably a dense film. As the protective film, a single layer or a stacked layer of any of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a sputtering method. In this embodiment, an example in which the protective film is formed by a sputtering method is described; however, there is no particular limitation on the method, and a variety of methods may be used.

Here, the insulating layer 4020 having a stacked structure is formed as the protective film. Here, a silicon oxide film is formed by a sputtering method, as a first layer of the insulating layer 4020. When the silicon oxide film is used as the protective film, the silicon oxide film has an effect of preventing a hillock of an aluminum film used as a source electrode layer and a drain electrode layer.

An insulating layer is formed as a second layer of the protective film. Here, a silicon nitride film is formed by a sputtering method, as a second layer of the insulating layer 4020. The use of the silicon nitride film as the protective film can prevent mobile ions of sodium or the like from entering a semiconductor region so that variation in electric characteristics of a TFT can be suppressed.

After the protective film is formed, annealing (200° C. to 400° C.) of the semiconductor layer may be performed.

The insulating layer 4021 is formed as the planarizing insulating film. An organic material having heat resistance, such as polyimide, acrylic, benzocyclobutene, polyamide, or epoxy can be used for the insulating layer 4021. In addition to such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

Note that a siloxane-based resin is a resin formed using a siloxane-based material as a starting material and having the bond of Si—O—Si. As for the siloxane-based resin, an organic group (e.g., an alkyl group or an aryl group) or a fluoro group may be used as a substituent. The organic group may include a fluoro group.

There is no particular limitation on the method for forming the insulating layer 4021, and the following method can be used depending on the material of the insulating layer 4021: a sputtering method, an SOG method, a spin coating method, a dip coating method, a spray coating method, a droplet discharge method (e.g., an inkjet method, screen printing, offset printing, or the like), a doctor knife, a roll coater, a curtain coater, a knife coater, or the like. When the insulating layer 4021 is formed using material liquid, annealing (200° C. to 400° C.) of the semiconductor layer may be performed in a baking step at the same time. A baking step of the insulating layer 4021 also serves as the annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode formed using a conductive composition preferably has a light transmittance of greater than or equal to 70% at a wavelength of 550 nm Further, the resistivity of the conductive polymer included in the conductive composition is preferably less than or equal to 0.1 Ω·cm.

As the conductive polymer, a so-called π-electron conjugated conductive polymer can be used. As examples thereof, polyaniline or a derivative thereof, polypyrrole or a derivative thereof, polythiophene or a derivative thereof, a copolymer of more than two kinds of them, and the like can be given.

Further, a variety of signals and potentials are supplied to the signal line driver circuit 4003 which is formed separately, the scan line driver circuit 4004 or the pixel portion 4002 from an FPC 4018.

In this embodiment, a connection terminal electrode 4015 is formed using the same conductive film as the pixel electrode layer 4030 included in the liquid crystal element 4013. A terminal electrode 4016 is formed using the same conductive film as the source and drain electrode layers included in the thin film transistors 4010 and 4011.

The connection terminal electrode 4015 is electrically connected to a terminal included in the FPC 4018 through an anisotropic conductive film 4019.

FIGS. 20A-1, 20A-2, and 20B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

This embodiment can be implemented in combination with any of the structures of the other embodiments as appropriate.

Embodiment 7

In this embodiment, electronic paper is described as an example of a semiconductor device including a transistor.

Figure 21:
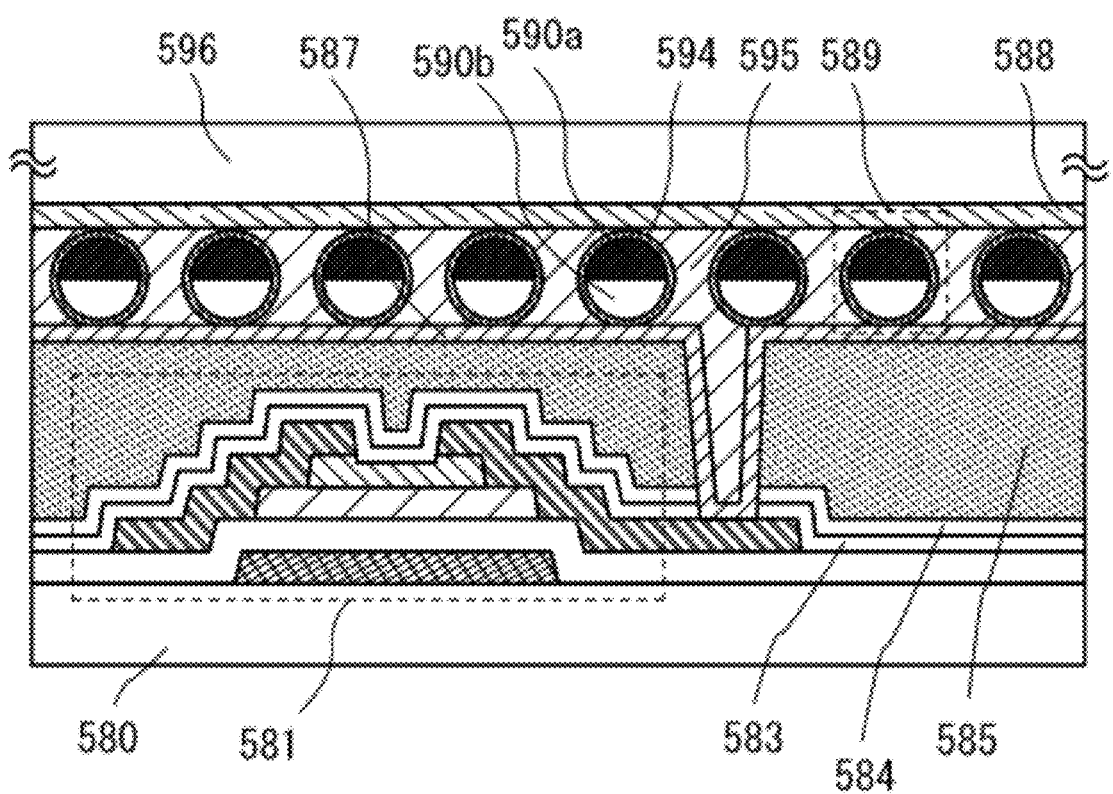
FIG. 21 illustrates an example of a semiconductor device according to Embodiment 7.

FIG. 21 illustrates active matrix electronic paper as an example of the semiconductor device. A thin film transistor 581 used for the semiconductor device can be formed in a manner similar to the thin film transistor described in any of Embodiments 1 to 5.

The electronic paper in FIG. 21 is an example of a display device using a twisting ball display system. The twisting ball display system refers to a method in which spherical particles each colored in black and white are arranged between a first electrode layer and a second electrode layer which are used for a display element, and a potential difference is generated between the first electrode layer and the second electrode layer to control orientation of the spherical particles, so that display is performed.

The thin film transistor 581 provided over a substrate 580 is a thin film transistor having a bottom gate structure. A source electrode layer or a drain electrode layer is electrically connected to a first electrode layer 587 through a contact hole formed in insulating layers 583, 584, and 585. Between the first electrode layer 587 and a second electrode layer 588, spherical particles 589 each including a black region 590*a* and a white region 590*b*, and a cavity 594 filled with liquid around the black region 590*a* and the white region 590*b* are provided. The circumference of each of the spherical particles 589 is provided with a filler 595 such as a resin (see FIG. 21). In FIG. 21, the first electrode layer 587 corresponds to a pixel electrode, and the second electrode layer 588 corresponds to a common electrode. The second electrode layer 588 is electrically connected to a common potential line provided on the same substrate as the thin film transistor 581. A common connection portion described in the above embodiment is used, whereby the second electrode layer 588 provided on a substrate 596 and the common potential line can be electrically connected to each other through the conductive particles arranged between a pair of substrates.

Further, instead of the twist ball, an electrophoretic element can also be used. In that case, a microcapsule having a diameter of approximately 10 μm to 200 μm, in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element, and is called electronic paper in general. The electrophoretic display element has higher reflectance than a liquid crystal display element, and thus, an assistant light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device including a display device) is distanced from an electric wave source.

In this manner, highly reliable electronic paper can be manufactured as a semiconductor device.

This embodiment can be implemented in combination with any of the structures of the other embodiments as appropriate.

Embodiment 8

In this embodiment, an example of a light-emitting display device will be described as a semiconductor device including a transistor. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions.

Next, the appearance and a cross section of a light-emitting display panel (also referred to as a light-emitting panel), which is one mode of the semiconductor device, will be described with reference to FIGS. 22A and 22B. FIG. 22A is a top view of the panel in which thin film transistors 4509 and 4510 and a light-emitting element 4511 are sealed between a first substrate 4501 and a second substrate 4506 with a sealant 4505. FIG. 22B is a cross-sectional view taken along line H-I of FIG. 22A. Note that description is made here using an organic EL element as a light-emitting element.

The sealant 4505 is provided to surround a pixel portion 4502, signal line driver circuits 4503*a* and 4503*b*, and scanning line driver circuits 4504*a* and 4504*b*, which are provided over the first substrate 4501. In addition, the second substrate 4506 is provided over the pixel portion 4502, the signal line driver circuits 4503*a* and 4503*b*, and the scanning line driver circuits 4504*a* and 4504*b*. Accordingly, the pixel portion 4502, the signal line driver circuits 4503*a* and 4503*b*, and the scanning line driver circuits 4504*a* and 4504*b* are sealed together with a filler 4507, by the first substrate 4501, the sealant 4505, and the second substrate 4506. It is preferable that the pixel portion 4502, the signal line driver circuits

4503*a* and 4503*b*, and the scanning line driver circuits 4504*a* and 4504*b* be thus packaged (sealed) with a protective film (such as a bonding film or an ultraviolet curable resin film) or a cover material with high air-tightness and little degasification so as not to be exposed to the outside air.

The pixel portion 4502, the signal line driver circuits 4503*a* and 4503*b*, and the scanning line driver circuits 4504*a* and 4504*b* formed over the first substrate 4501 each include a plurality of thin film transistors, and the thin film transistor 4510 included in the pixel portion 4502 and the thin film transistor 4509 included in the signal line driver circuit 4503*a* are illustrated as an example in FIG. 22B.

Any of the structures described in the above embodiments can be applied to the thin film transistors 4509 and 4510. In this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that although the light-emitting element 4511 has a stacked structure of the first electrode layer 4517, an electroluminescent layer 4512, and a second electrode layer 4513, the structure of the light-emitting element 4511 is not limited to the structure described in this embodiment. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed of a photosensitive material to have an opening over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503*a* and 4503*b*, the scanning line driver circuits 4504*a* and 4504*b*, or the pixel portion 4502 from FPCs 4518*a* and 4518*b*.

In this embodiment, a connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal of the FPC 4518*a* through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scanning line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 22A and 22B.

Through the above-described process, a highly reliable light-emitting display device (display panel) as a semiconductor device can be manufactured.

This embodiment can be implemented in combination with any of the structures described in other embodiments, as appropriate.

Embodiment 9

A semiconductor device including any of the transistors described in the above embodiments can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, a large-sized game machine such as a pachinko machine, and the like.

Figure 23A:
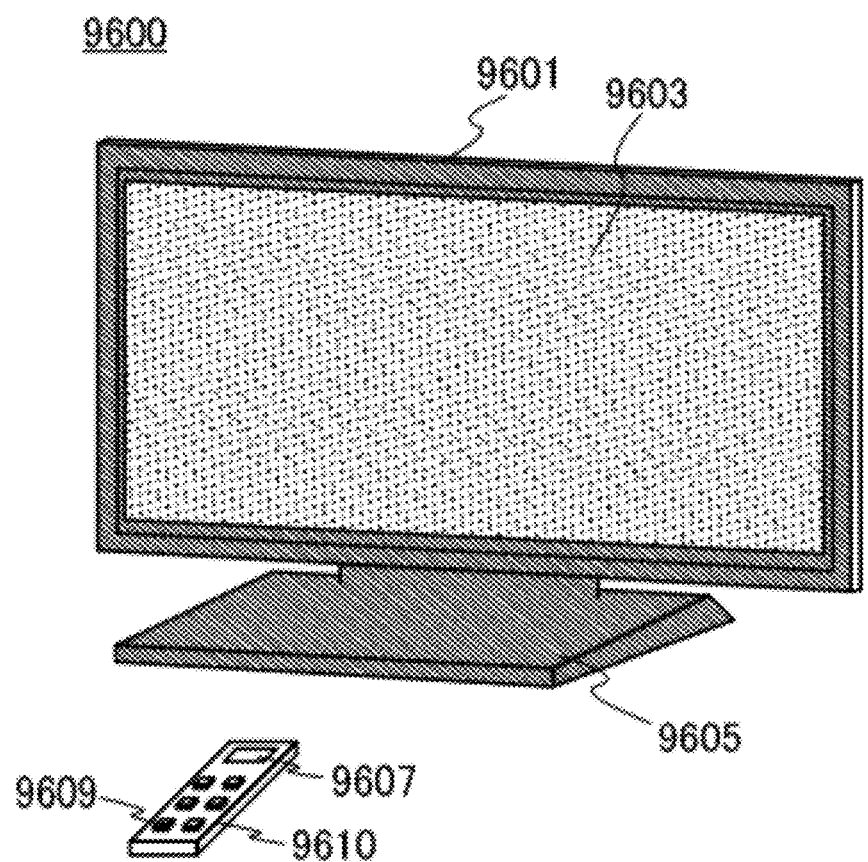
FIGS. 23A and 23B are external views illustrating a television device and a digital photo frame, respectively.

FIG. 23A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 23B:
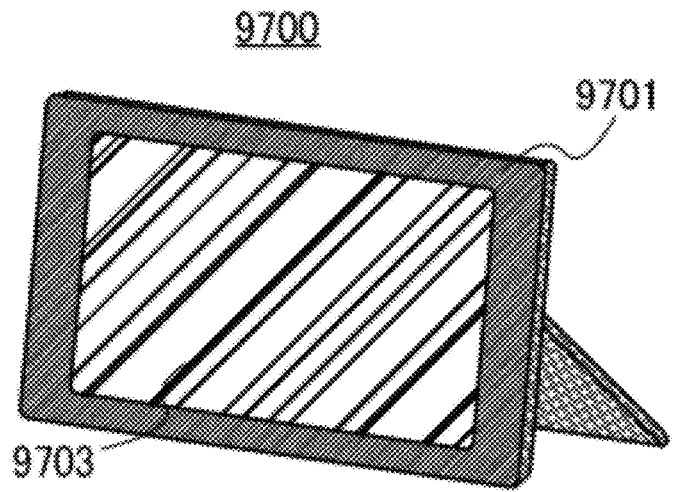

FIG. 23B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory which stores data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 24A:
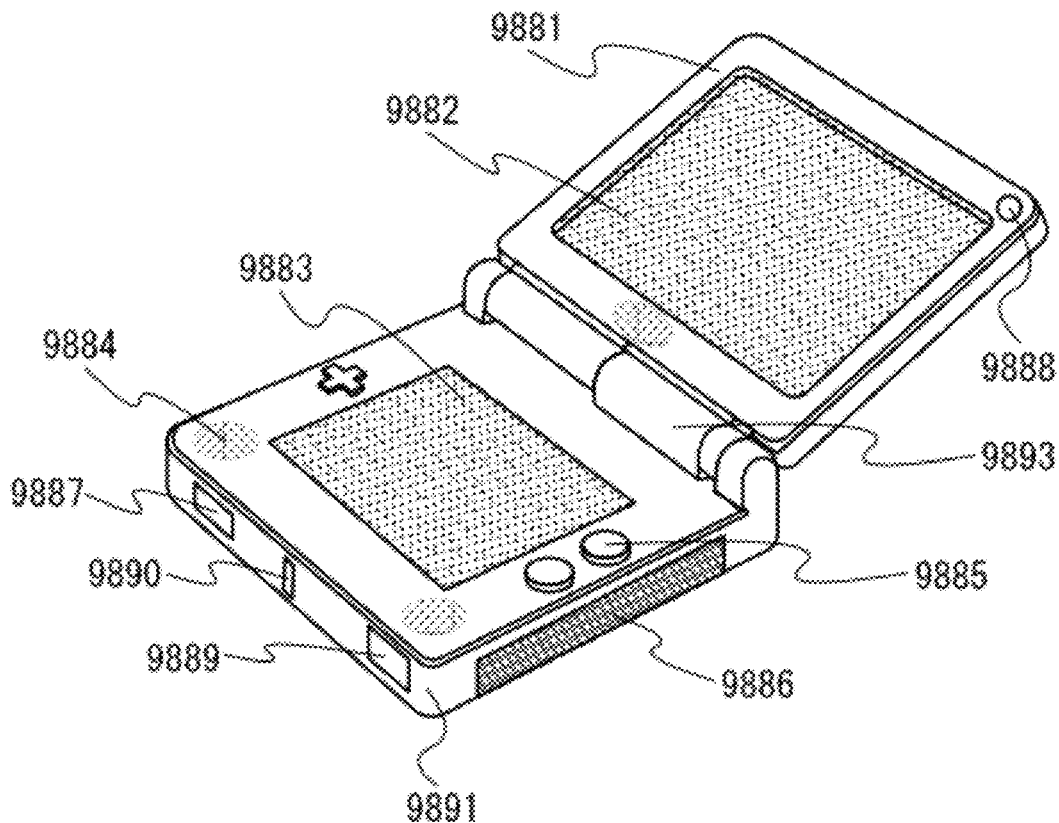
FIGS. 24A and 24B are external views illustrating amusement machines.

FIG. 24A is a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 24A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device may be employed. The portable amusement machine may include another accessory equipment as appropriate. The portable amusement machine illustrated in FIG. 24A has a function of reading a program or data stored in a recording medium to display it on the display portion, and a function of sharing information with another portable amusement machine by wireless communication. The portable amusement machine illustrated in FIG. 24A can have various functions without limitation to the above.

Figure 24B:
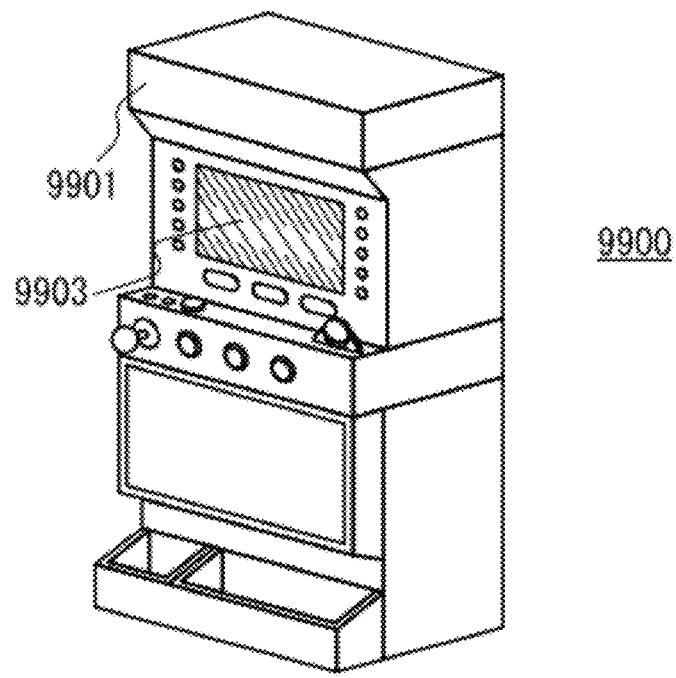

FIG. 24B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device may be employed. The slot machine 9900 may include another accessory equipment as appropriate.

This embodiment can be implemented in combination with any of the structures described in other embodiments, as appropriate.

This application is based on Japanese Patent Application serial no. 2009-030969 filed with Japan Patent Office on Feb. 13, 2009, the entire contents of which are hereby incorporated by reference.

What is claimed is:

1. A transistor comprising:
   a gate electrode;
   a gate insulating layer provided over the gate electrode;
   an oxide semiconductor layer provided over the gate insulating layer and overlapping with the gate electrode;
   a silicon layer provided over and in contact with a surface of the oxide semiconductor layer; and
   a source electrode layer and a drain electrode layer electrically connected to the oxide semiconductor layer.

2. The transistor according to claim 1,
   wherein the silicon layer is provided over and in contact with a part of the surface of the oxide semiconductor layer, and
   wherein the source electrode layer and the drain electrode layer are provided over and in contact with at least a part of the surface of the oxide semiconductor layer, over which the silicon layer is not provided.

3. The transistor according to claim 2,
   wherein a first low-resistance region serving as a source region is provided in a region of the oxide semiconductor layer, which is in contact with the source electrode layer, and
   wherein a second low-resistance region serving as a drain region is provided in a region of the oxide semiconductor layer, which is in contact with the drain electrode layer.

4. The transistor according to claim 1, wherein the oxide semiconductor layer includes at least one of indium, zinc, and gallium.

5. A semiconductor device comprising the transistor according to claim 1.

6. A manufacturing method of a transistor, comprising the steps of:
   forming a gate electrode over a substrate;
   forming a gate insulating layer over the gate electrode;
   forming an oxide semiconductor layer over the gate insulating layer so as to overlap with the gate electrode;
   forming a silicon layer so as to cover the oxide semiconductor layer;
   etching the silicon layer to expose a part of the oxide semiconductor layer;
   forming a conductive film over the silicon layer and the oxide semiconductor layer; and
   etching the conductive film to form a source electrode layer and a drain electrode layer.

7. The manufacturing method of a transistor according to claim 6,
   wherein the source electrode layer and the drain electrode layer are formed in contact with at least parts of the exposed oxide semiconductor layer.

8. The manufacturing method of a transistor according to claim 6, wherein the silicon layer is formed by a DC sputtering method.

* * * * *